(12) United States Patent
Higuchi

(10) Patent No.: US 11,616,474 B2
(45) Date of Patent: *Mar. 28, 2023

(54) CIRCUIT DEVICE AND OSCILLATOR

(71) Applicant: Seiko Epson Corporation, Tokyo (JP)

(72) Inventor: Teppei Higuchi, Chino (JP)

(73) Assignee: SEIKO EPSON CORPORATION

( * ) Notice: Subject to any disclaimer, the term of this patent is extended or adjusted under 35 U.S.C. 154(b) by 0 days.

This patent is subject to a terminal disclaimer.

(21) Appl. No.: 17/483,889

(22) Filed: Sep. 24, 2021

(65) Prior Publication Data

US 2022/0103124 A1    Mar. 31, 2022

(30) Foreign Application Priority Data

Sep. 25, 2020   (JP) .............................. JP2020-160717

(51) Int. Cl.
*H03B 5/04* (2006.01)
*H03K 3/03* (2006.01)
*H03B 5/32* (2006.01)

(52) U.S. Cl.
CPC .............. *H03B 5/04* (2013.01); *H03B 5/326* (2013.01); *H03K 3/0315* (2013.01)

(58) Field of Classification Search
CPC ...................................................... H03B 5/04
USPC ................................................... 331/57, 158
See application file for complete search history.

(56) References Cited

U.S. PATENT DOCUMENTS

| 2006/0192626 A1* | 8/2006 | Milliren ................ H03L 1/04 331/158 |
| 2015/0123740 A1 | 5/2015 | Itasaka et al. |
| 2016/0218718 A1 | 7/2016 | Yamamoto |
| 2016/0218719 A1 | 7/2016 | Yamamoto |
| 2017/0194966 A1 | 7/2017 | Yonezawa |

FOREIGN PATENT DOCUMENTS

| JP | 2006-054269 A | 2/2006 |
| JP | 2006-191517 A | 7/2006 |
| JP | 2015-090973 A | 5/2015 |
| JP | 2016-134888 A | 7/2016 |
| JP | 2016-134889 A | 7/2016 |
| JP | 2017-123631 A | 7/2017 |

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit generating an oscillation signal by oscillating a vibrator, a temperature sensor circuit performing an intermittent operation, a logic circuit performing temperature compensation processing based on an output of the temperature sensor circuit, and a power supply circuit supplying power to the oscillation circuit. Further, the logic circuit or the power supply circuit is disposed between the oscillation circuit and the temperature sensor circuit.

13 Claims, 20 Drawing Sheets

FIG. 2
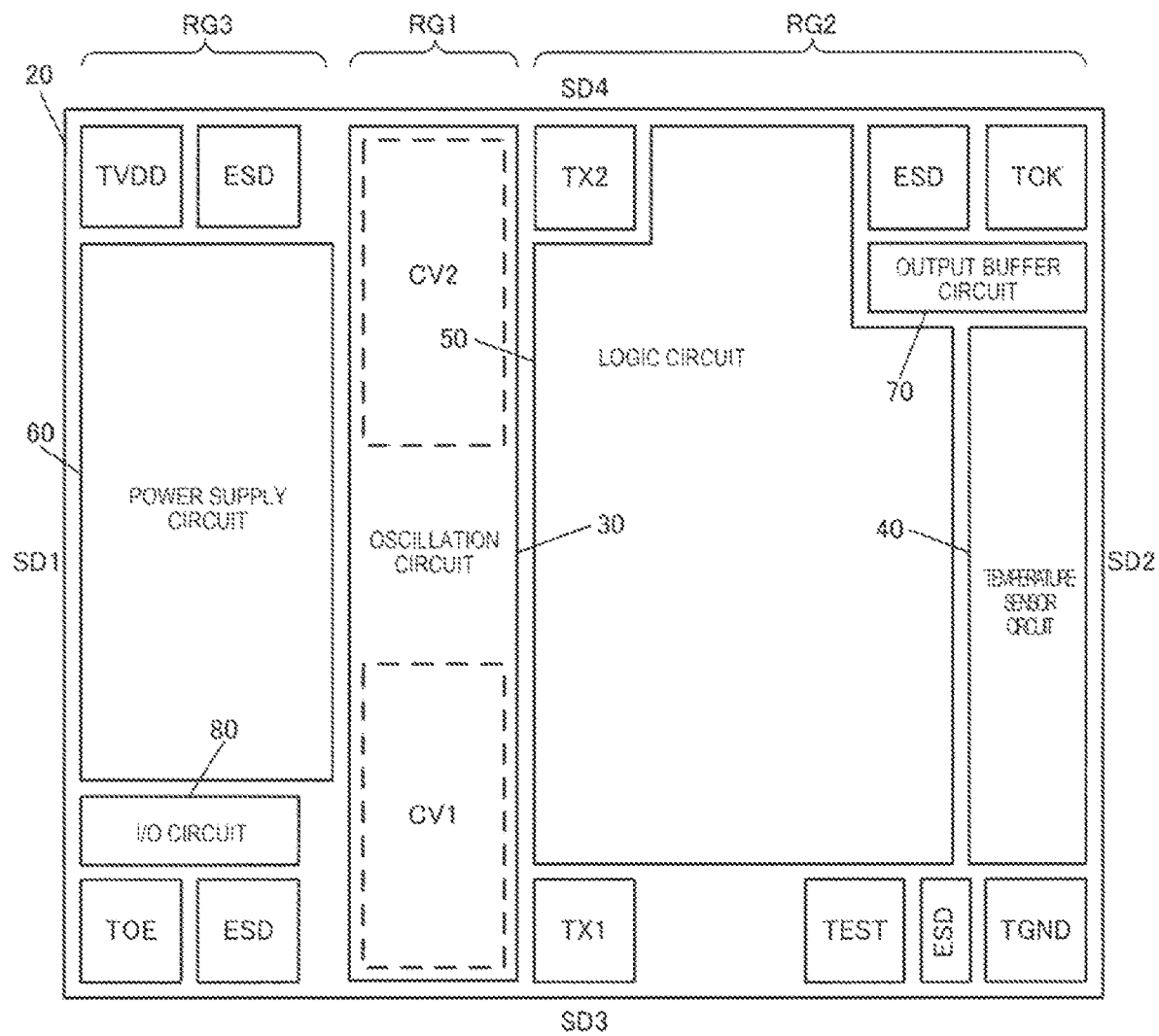
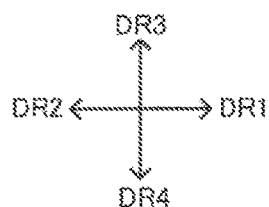

CIRCUIT DEVICE AND OSCILLATOR

The present application is based on, and claims priority from JP Application Serial Number 2020-160717, filed Sep. 25, 2020, the disclosure of which is hereby incorporated by reference herein in its entirety.

BACKGROUND

1. Technical Field

The present disclosure relates to a circuit device, an oscillator, and the like.

2. Related Art

In the related art, a circuit device having an oscillation circuit that oscillates a vibrator such as a quartz crystal vibrator is known. JP-A-2015-90973 discloses a layout disposition of a circuit device having a temperature compensated oscillation circuit. In JP-A-2015-90973, a circuit block having an analog circuit as a component and a circuit block having a digital circuit as a component are disposed separately, and the wiring that electrically couples the analog circuit and the vibrator is laid out so that the wiring does not overlap with the block of the digital circuit.

A temperature sensor circuit is used for temperature compensation processing of an oscillation frequency of an oscillation circuit. A target of the temperature compensation processing is the oscillation frequency of a vibrator. Therefore, in order to measure the temperature of the vibrator more accurately, the temperature sensor circuit is usually disposed near the oscillation circuit to which the vibrator is electrically coupled. This is because the heat of the vibrator is transferred from the vibrator to the oscillation circuit via a metal terminal or a wiring.

On the other hand, in a circuit device having a temperature compensated oscillation circuit, it is conceivable to operate the temperature sensor circuit intermittently in order to achieve low power consumption. However, when the temperature sensor circuit performs the intermittent operation in this way, the current consumption of the temperature sensor circuit changes in an AC manner. Therefore, it has been found that when such a temperature sensor circuit is close to the oscillation circuit, the temperature sensor circuit may become a noise source and the signal characteristics of the oscillation signal of the oscillation circuit may deteriorate.

SUMMARY

An aspect of the present disclosure relates to a circuit device including: an oscillation circuit generating an oscillation signal by oscillating a vibrator; a temperature sensor circuit performing an intermittent operation; a logic circuit performing temperature compensation processing based on an output of the temperature sensor circuit; and a power supply circuit supplying power to the oscillation circuit, in which the logic circuit or the power supply circuit is disposed between the oscillation circuit and the temperature sensor circuit.

Further, another aspect of the present disclosure relates to an oscillator including the circuit device described above and the vibrator.

BRIEF DESCRIPTION OF THE DRAWINGS

FIG. 2 illustrates an example of a layout disposition of the circuit device of the present embodiment.

DESCRIPTION OF EXEMPLARY EMBODIMENTS

Hereinafter, the present embodiment will be described. The present embodiment to be described below does not unduly limit the contents of the disclosure described in the appended claims. Further, all configurations to be described in the present embodiment are not limited to being essential constituent conditions.

1. Circuit Device

Figure 1:
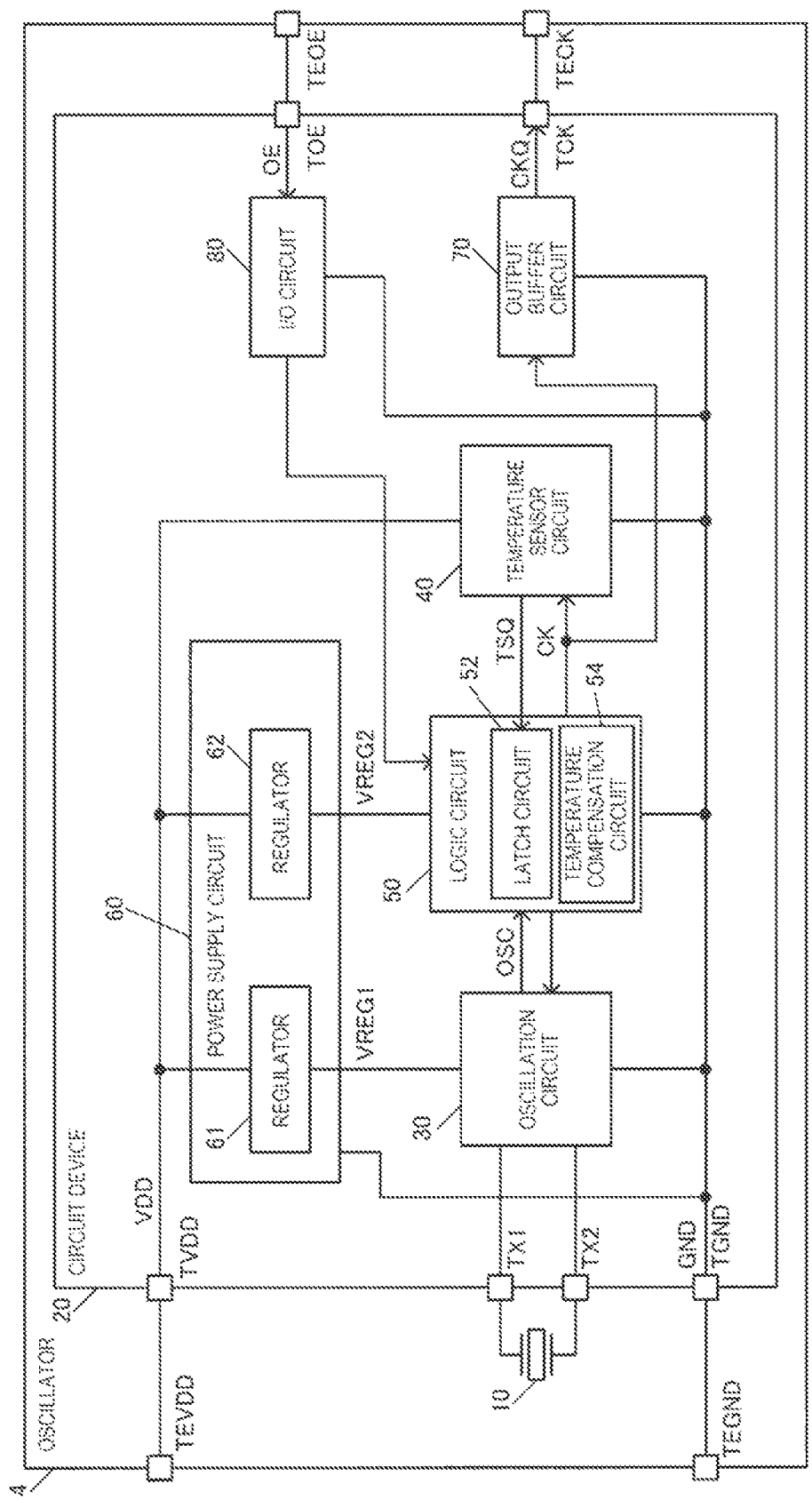
FIG. 1 illustrates an example of a configuration of a circuit device of the present embodiment.

FIG. 1 illustrates an example of a configuration of a circuit device 20 according to the present embodiment. The circuit device 20 of the present embodiment includes an oscillation circuit 30, a temperature sensor circuit 40, a logic circuit 50, and a power supply circuit 60. Further, the oscillator 4 of the present embodiment includes a vibrator 10 and the circuit device 20. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element generating mechanical vibration by an electric signal. The vibrator 10 can be realized by a vibrator element such as a quartz crystal vibrator element, for example. For example, the vibrator 10 can be realized by a tuning fork type quartz crystal vibrator element, a twin tuning fork type quartz crystal vibrator element, or a quartz crystal vibrator element whose cut angle vibrates in a thickness-slide manner such as an AT cut or an SC cut. For example, the vibrator 10 may be a vibrator built in a temperature compensated crystal oscillator (TCXO) having no constant temperature oven, or a vibrator built in a constant temperature oven controlled crystal oscillator (OCXO) having a constant temperature oven. Note that, the vibrator 10 according to the present embodiment can be realized by various vibrator elements such as vibrator elements other than a tuning fork type, twin tuning fork type, or a thickness-slide vibration type, or piezoelectric vibrator elements made of materials other than quartz crystal. For example, as the vibrator 10, a surface acoustic wave (SAW) resonator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process and is a semiconductor chip in which circuit elements are formed on a semiconductor substrate. In FIG. 1, the circuit device 20 includes the oscillation circuit 30, the temperature sensor circuit 40, the logic circuit 50, the power supply circuit 60, an output buffer circuit 70, and an I/O circuit 80.

The oscillation circuit 30 is a circuit that oscillates the vibrator 10. For example, the oscillation circuit 30 is electrically coupled to the terminals TX1 and TX2 and generates an oscillation signal OSC by causing the vibrator 10 to oscillate. As an example, the oscillation circuit 30 generates an oscillation signal OSC having a frequency of, for example, 32 KHz. The terminal TX1 is a first terminal, and the terminal TX2 is a second terminal. For example, the oscillation circuit 30 can be realized by a drive circuit for oscillation provided between the terminal TX1 and the terminal TX2 and an active element such as a capacitor or a resistor. The drive circuit can be realized by, for example, a CMOS inverter circuit or a bipolar transistor. The drive circuit is a core circuit of the oscillation circuit 30, and the drive circuit oscillates the vibrator 10 by voltage driving or current driving the vibrator 10. As the oscillation circuit 30, various types of oscillation circuits can be used such as an inverter type, a Pierce type, a Colpitts type, or a Hartley type. Further, the oscillation circuit 30 is provided with a variable capacitance circuit and can adjust the oscillation frequency by adjusting the capacitance of the variable capacitance circuit. The variable capacitance circuit can be realized by, for example, a capacitor array and a switch array coupled to the capacitor array. For example, the variable capacitance circuit includes a first capacitor array having a plurality of capacitors whose capacitance values are binary weighted. Further, the variable capacitance circuit includes a first switch array having a plurality of switches in which each switch turns on and off the coupling between each capacitor in the first capacitor array and terminal TX1. Further, as the variable capacitance circuit, a first variable capacitance circuit, which has the first capacitor array and the first switch array and is coupled to terminal TX1, and a second variable capacitance circuit, which has the second capacitor array and the second switch array and is coupled to the terminal TX2, may be provided. Note that, it is also possible to realize the variable capacitance circuit by a variable capacitance element such as a varactor. Further, coupling in the present embodiment is electrical coupling. The electrical coupling is coupling that an electrical signal can be transmitted, and coupling that enables transmission of information by an electrical signal. The electrical coupling may be coupling via an active element or the like.

Figure 5:
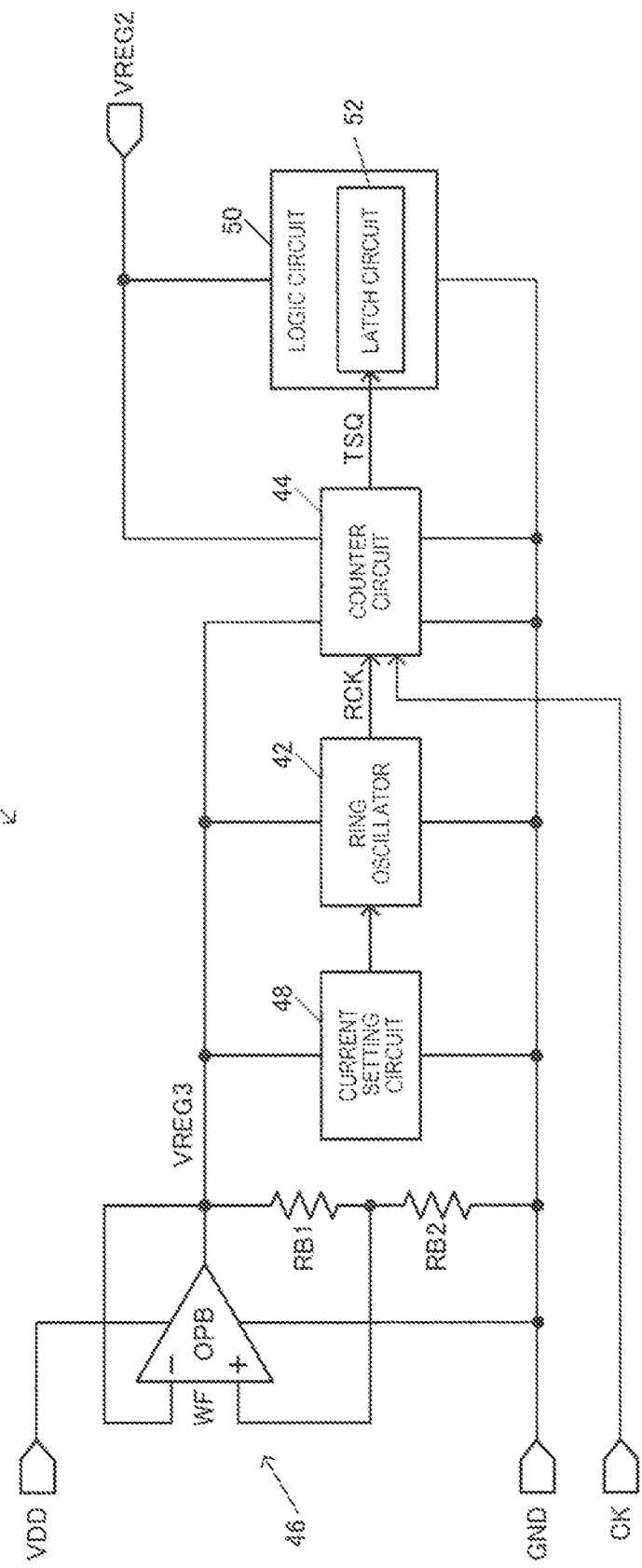
FIG. 5 illustrates an example of a configuration of a temperature sensor circuit.

The temperature sensor circuit 40 measures the temperature such as the environmental temperature of the vibrator 10 or the circuit device 20, and outputs the result as temperature data TSQ. The temperature data TSQ is data, for example, that monotonously increases or monotonously decreases with respect to the temperature in an operation temperature range of the circuit device 20. The temperature sensor circuit 40 is a temperature sensor that utilizes the fact that the oscillation frequency of the ring oscillator 42 has a temperature dependency, as illustrated in FIG. 5 described later. Specifically, as illustrated in FIG. 5, the temperature sensor circuit 40 includes a ring oscillator 42 and a counter circuit 44. In a count period TSENS defined by a clock signal CK based on the oscillation signal OSC from the oscillation circuit 30, the counter circuit 44 counts an output pulse signal RCK, which is an oscillation signal of the ring oscillator 42 and outputs the count value as the temperature data TSQ. Note that, the temperature sensor circuit 40 is not limited to this, for example, an analog temperature sensor, which outputs a temperature detection voltage by utilizing the fact that a forward voltage of the PN junction has a temperature dependency, and an A/D conversion circuit, which A/D converts the temperature detection voltage and outputs the temperature data TSQ, may be included.

In the present embodiment, the temperature sensor circuit 40 performs an intermittent operation. For example, the temperature sensor circuit 40 performs the intermittent operation of obtaining the temperature data TSQ corresponding to the temperature during the operation period and stopping the operation of the temperature sensor circuit 40 after outputting the obtained temperature data TSQ to the logic circuit 50. The details of the intermittent operation will be described later.

The logic circuit 50 performs temperature compensation processing based on the output of the temperature sensor circuit 40. This temperature compensation processing is performed by the temperature compensation circuit 54 of the logic circuit 50. The temperature compensation processing is, for example, processing of compensating by reducing fluctuations in the oscillation frequency caused by the temperature fluctuations. That is, the logic circuit 50 performs the temperature compensation processing for the oscillation frequency of the oscillation circuit 30 so that the frequency becomes constant even when the temperature fluctuates. Specifically, the logic circuit 50 performs the digital temperature compensation processing based on the temperature data TSQ that is the output of the temperature sensor circuit 40. For example, the logic circuit 50 obtains frequency adjustment data based on the temperature data TSQ. Further, by adjusting the capacitance value of the variable capacitance circuit of the oscillation circuit 30 described above based on the obtained frequency adjustment data, the temperature compensation processing for the oscillation frequency of the oscillation circuit 30 is realized. For example, the logic circuit 50 has a storage circuit, and the storage circuit stores a lookup table that represents the correspondence between the temperature data TSQ and the frequency adjustment data. The logic circuit 50 performs the temperature compensation processing for obtaining frequency adjustment data from the temperature data TSQ by using the lookup table. The storage circuit can be realized by, for example, a non-volatile memory. The non-volatile memory is, for example, an EEPROM such as a FAMOS memory or a MONOS memory, but is not limited to this, and may be an OTP memory, a fuse type ROM, or the like. Alternatively, the storage circuit may be realized by a RAM or may be realized by a register configured with a latch circuit or the like. Note that, the logic circuit 50 may perform arithmetic processing for converting the temperature data TSQ into converted temperature data, and the lookup table may be a table that represents the correspondence between the converted temperature data and the frequency adjustment data. The converted temperature data is data that monotonously increases or monotonously decreases with respect to the temperature similar to the temperature data TSQ, but the slope of the converted temperature data is converted from the slope of the temperature data TSQ corresponding to the temperature range.

The logic circuit 50 is a control circuit and performs various control processes. For example, the logic circuit 50 controls the entire circuit device 20 and controls the operation sequence of the circuit device 20. Further, the logic circuit 50 may perform various processing for controlling the oscillation circuit 30 or may control the temperature sensor circuit 40 or the power supply circuit 60. The logic circuit 50 can be realized, for example, by an application specific integrated circuit (ASIC) configured with automatic placement and wiring such as a gate array.

The power supply voltage VDD from the power supply terminal TVDD is supplied to the power supply circuit 60, and the power supply circuit 60 supplies various power supply voltages for the internal circuit of the circuit device 20 to the internal circuit. The power supply circuit 60 can also be said to be a reference signal generation circuit that generates a reference signal such as a reference voltage or a reference current used in the circuit device 20. For example, the power supply circuit 60 supplies power to at least the oscillation circuit 30. Further, the power supply circuit 60 may supply power to the logic circuit 50. Specifically, in FIG. 1, the power supply circuit 60 has a regulator 61, and the regulator 61 supplies a regulated power supply voltage VREG1 to the oscillation circuit 30 as a power source by regulating the power supply voltage VDD, which is an external power supply voltage. Further, the power supply circuit 60 has a regulator 62, and the regulator 62 supplies a regulated power supply voltage VREG2 to the logic circuit 50 as a power source by regulating the power supply voltage VDD. The VDD is, for example, a voltage of 1.5 to 3.6 V. Further, the VREG1 has a voltage of, for example, 0.9 to 1.1 V, and the VREG2 has a voltage of, for example, 1.1 to 1.3 V. Further, the VREG3 described later is, for example, a voltage of 1.25 to 1.45 V.

The output buffer circuit 70 outputs an output clock signal CKQ based on the oscillation signal OSC. For example, the output buffer circuit 70 buffers the clock signal CK based on the oscillation signal OSC and outputs the clock signal CK as the output clock signal CKQ to the clock terminal TCK. Thereafter, the output clock signal CKQ is output to the outside via the external terminal TECK of the oscillator 4. For example, the output buffer circuit 70 outputs the output clock signal CKQ in a single-ended CMOS signal format. For example, the logic circuit 50 outputs the clock signal CK based on the oscillation signal OSC that is an oscillation clock signal from the oscillation circuit 30. For example, the logic circuit 50 receives an output enable signal OE from an output enable terminal TOE via the I/O circuit 80. Thereafter, the logic circuit 50 outputs the oscillation signal OSC as the clock signal CK when the output enable signal OE is active. Thereafter, the output buffer circuit 70 buffers the clock signal CK and outputs the clock signal CK as the output clock signal CKQ. On the other hand, the logic circuit 50 sets the clock signal CK to a fixed voltage level such as a low level, for example, when the output enable signal OE is inactive. As a result, the voltage level of the clock terminal TCK is set to a fixed voltage level. Note that, a phrase that the signal is active means, for example, that the signal is a high level in the case of a positive logic and is a low level in the case of a negative logic. Further, a phrase that the signal is inactive means, for example, that the signal is a low level in the case of a positive logic and is a high level in the case of a negative logic. Note that, the output buffer circuit 70 may output the output clock signal CKQ in a signal format other than CMOS.

The I/O circuit 80 is a circuit that receives the output enable signal OE from the output enable terminal TOE and outputs the output enable signal OE to the logic circuit 50. The I/O circuit 80 can include, for example, a test circuit for inspection such as an analog circuit of the circuit device 20.

The circuit device 20 also includes the power supply terminal TVDD, a ground terminal TGND, and a clock terminal TCK. Further, the circuit device 20 includes terminals TX1 and TX2 for coupling the vibrator and the output enable terminal TOE. These terminals are, for example, pads of the circuit device 20 which is a semiconductor chip. For example, in the pad region, a metal layer is exposed from a passivation film which is an insulation layer, and the exposed metal layer constitutes a pad which is a terminal of the circuit device 20.

The power supply terminal TVDD is a terminal to which the power supply voltage VDD is supplied. For example, the power supply voltage VDD from an external power supply device is supplied to the power supply terminal TVDD. The ground terminal TGND is a terminal to which a ground voltage GND is supplied. GND can also be referred to VSS, and the ground voltage is, for example, a ground potential. In the present embodiment, a ground is appropriately referred to as GND. The clock terminal TCK is a terminal to which the output clock signal CKQ, which is generated based on the oscillation signal OSC of the oscillation circuit 30, is output. The output enable terminal TOE is a terminal for controlling the enable and disable of the output of the output clock signal CKQ. The power supply terminal TVDD, the ground terminal TGND, the clock terminal TCK, and the output enable terminal TOE are electrically coupled to the external terminals TEVDD, TEGND, TECK, and TEOE for external coupling of the oscillator 4, respectively. For example, the electrical coupling is made using an internal wiring of a package, a bonding wire, a metal bump, or the like. Further, the external terminals TEVDD, TEGND, TECK, and TEOE of the oscillator 4 are electrically coupled to the external device.

The terminal TX1 which is the first terminal is electrically coupled to one end of the vibrator 10, and the terminal TX2 which is the second terminal is electrically coupled to the other end of the vibrator 10. For example, the terminals TX1 and TX2 of the circuit device 20 and the vibrator 10 are electrically coupled with each other using internal wiring, a bonding wire, a metal bump, or the like of a package that accommodates the vibrator 10 and the circuit device 20.

Figure 3:
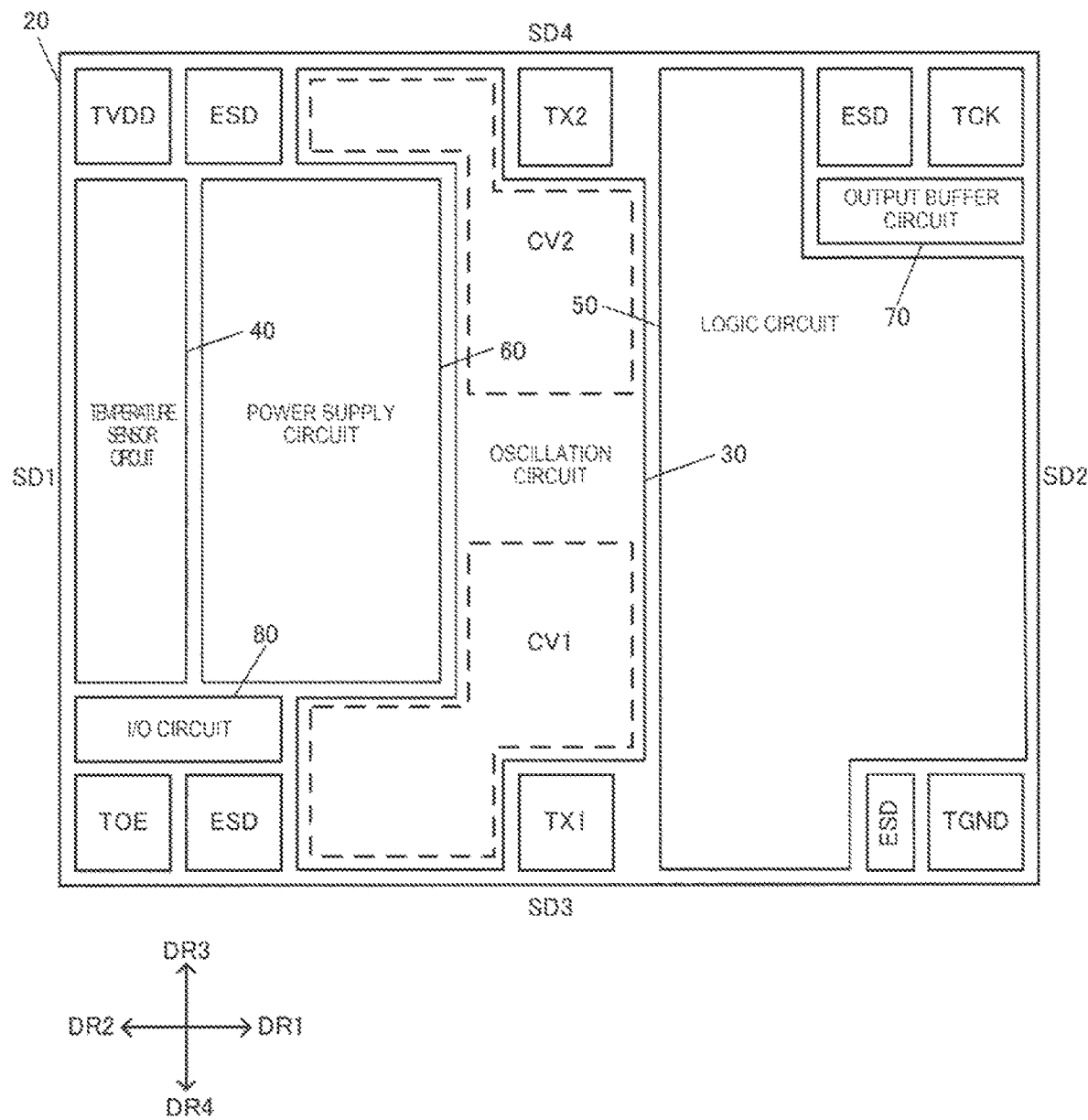
FIG. 3 illustrates an example of a layout disposition of the circuit device of the present embodiment.

FIGS. 2 and 3 illustrate an example of a layout disposition of the circuit device 20 of the present embodiment. In the example of the layout disposition in FIGS. 2 and 3, the layout disposition of each circuit of the circuit device 20 described with reference to FIG. 1 is illustrated. FIGS. 2 and 3 illustrate an example of the disposition in a plan view seen from a direction orthogonal to a substrate on which the circuit element of the circuit device 20 is formed. Note that, in FIGS. 2 and 3, "ESD" is an electrostatic protection circuit, and "TEST" is a terminal for testing used at the time of inspection of the circuit device 20.

The circuit device 20 has sides SD1, SD2, SD3, and SD4. The sides SD1, SD2, SD3, and SD4 are a first side, a second side, a third side, and a fourth side, respectively. The sides SD1, SD2, SD3, and SD4 correspond to the sides of the rectangular semiconductor chip which is the circuit device 20. For example, the sides SD1, SD2, SD3, and SD4 are the sides of a substrate of the semiconductor chip. The semiconductor chips are also called silicon dies. The side SD2 is an opposite side of the side SD1. The side SD3 is a side that intersects the sides SD1 and SD2. The intersection means, for example, orthogonal. The side SD4 is an opposite side of the side SD3. The side SD4 intersects sides SD1 and SD2. A direction from the side SD1 toward the side SD2 is referred to as DR1, and a direction opposite to the direction DR1 is referred to as DR2. Further, a direction from the side SD3 toward the side SD4 is referred to as DR3, and a direction opposite to the direction DR3 is referred to as DR4. The directions DR1, DR2, DR3, and DR4 are a first direction, a second direction, a third direction, and a fourth direction, respectively.

As described with reference to FIG. 1, the circuit device 20 of the present embodiment includes the oscillation circuit 30 that oscillates the vibrator 10 to generate the oscillation signal OSC, the temperature sensor circuit 40 that performs the intermittent operation, a logic circuit that performs the temperature compensation processing based on the output of the temperature sensor circuit 40, and the power supply circuit 60 that supplies power to the oscillation circuit 30. For example, the regulated power supply voltage VREG1 is supplied from the power supply circuit 60 to the oscillation circuit 30 as a power source, and the oscillation circuit 30 generates the oscillation signal OSC by performing an oscillation operation to oscillate the vibrator 10. The temperature sensor circuit 40 detects the temperature while performing the intermittent operation that repeats an operation period and a stop period and outputs the detection result as temperature data TSQ to the logic circuit 50. The logic circuit 50 performs the temperature compensation processing based on the temperature data TSQ which is an output of the temperature sensor circuit 40. For example, the logic circuit 50 performs the temperature compensation processing that keeps the oscillation frequency of the oscillation circuit 30 constant even when the environmental temperature fluctuates. Specifically, the temperature compensation processing for the oscillation frequency is realized by adjusting the capacitance values of the variable capacitance circuits CV1 and CV2 of the oscillation circuit 30, which will be described later in detail in FIG. 4, based on the capacitance value adjustment data, which is the frequency adjustment data obtained by the temperature data TSQ. The variable capacitance circuit CV1 is a first variable capacitance circuit, and the variable capacitance circuit CV2 is a second variable capacitance circuit.

In the present embodiment, as illustrated in FIGS. 2 and 3, the logic circuit 50 or the power supply circuit 60 is disposed between the oscillation circuit 30 and the temperature sensor circuit 40.

For example, in the example of the layout disposition of FIG. 2, the logic circuit 50 is disposed between the oscillation circuit 30 and the temperature sensor circuit 40. For example, when the direction from the side SD1 toward an opposite side SD2 of the circuit device 20 is defined as DR1, the logic circuit 50 is disposed on the direction DR1 side of the oscillation circuit 30, and the temperature sensor circuit 40 is disposed on the direction DR1 side of the logic circuit 50. The temperature sensor circuit 40 is disposed along, for example, the side SD2. Further, when the direction opposite to the direction DR1 is defined as DR2, the power supply circuit 60 is disposed on the direction DR2 side of the oscillation circuit 30. The power supply circuit 60 is disposed along, for example, the side SD1. In other words, in FIG. 2, a distance between the oscillation circuit 30 and the temperature sensor circuit 40 is larger than a distance between the oscillation circuit 30 and the logic circuit 50. That is, the temperature sensor circuit 40 is disposed at a distance farther from the oscillation circuit 30 as compared with that of the logic circuit 50. Note that, the fact that the third circuit is disposed between the first circuit and the second circuit means that, for example, the third circuit is positioned between a position of the first circuit and a position of the second circuit. Further, a distance between the first circuit and the second circuit can be said to be, for example, a distance between the position of the first circuit and the position of the second circuit. A position of the circuit is, for example, a representative position of the circuit, for example, a center position or a center of gravity position of the circuit.

Further, in FIG. 2, the temperature sensor circuit 40 and the logic circuit 50 are disposed in a circuit region RG2, and the power supply circuit 60 is disposed in a circuit region RG3. The oscillation circuit 30 is disposed in a circuit region RG1, which is between the circuit region RG2 and the circuit region RG3. The circuit regions RG1, RG2, and RG3 are a first circuit region, a second circuit region, and a third circuit region, respectively. For example, the circuit region RG3 is a region along the side SD1, and the circuit region RG2 is a region along the side SD2 which is an opposite side of the side SD1. The circuit region RG1 is a region positioned between the circuit region RG3 and the circuit region RG2. For example, the temperature sensor circuit 40 and the logic circuit 50 are disposed in the circuit region RG2 on the direction DR1 side of the circuit region RG1 where the oscillation circuit 30 is disposed, and the power supply circuit 60 is disposed in the circuit region RG3 on the direction DR2 side of the circuit region RG1. The circuit region is a region in which circuit elements constituting the circuit and wirings coupling between the circuit elements are disposed. The circuit element is an active element such as a transistor or a passive element such as a resistor or a capacitor. For example, in FIG. 2, the circuit regions RG1, RG2, and RG3 are rectangular regions. The rectangular region includes a region having a substantially rectangular shape. For example, the circuit region RG3 in which the power supply circuit 60 is disposed is a rectangular region having the direction DR3 along the side SD1 as the long side direction. The circuit region RG1 in which the oscillation circuit 30 is disposed is also a rectangular region having the direction DR3 as the long side direction. The circuit region RG2 in which the temperature sensor circuit 40 and the logic circuit 50 are disposed is a rectangular region having the direction DR3 as the long side direction but may be a rectangular region having the direction DR1 along the side SD3 as the long side direction. Although the circuit regions RG1, RG2, and RG3 are rectangular regions in FIG. 2, the regions may be regions having a shape other than a rectangle.

On the other hand, in the example of the layout disposition in FIG. 3, the power supply circuit 60 is disposed between the oscillation circuit 30 and the temperature sensor circuit 40. For example, in FIG. 3, the temperature sensor circuit 40 is disposed along the side SD1 of the circuit device 20. When a direction from the side SD1 toward the side SD2 is defined as DR1, the power supply circuit 60 is disposed on the direction DR1 side of the temperature sensor circuit 40, and the oscillation circuit 30 is disposed on the direction DR1 side of the power supply circuit 60. Further, the logic circuit 50 is disposed on the direction DR1 side of the oscillation circuit 30. The logic circuit 50 is disposed along the side SD2, for example. In other words, in FIG. 3, a distance between the oscillation circuit 30 and the temperature sensor circuit 40 is larger than a distance between the oscillation circuit 30 and the power supply circuit 60. That is, the temperature sensor circuit 40 is disposed at a distance farther from the oscillation circuit 30 as compared with that of the power supply circuit 60.

For example, in the present embodiment, in order to reduce the current consumption of the circuit device 20, the temperature sensor circuit 40 performs the intermittent operation instead of performing a constant operation. By the temperature sensor circuit 40 to perform the intermittent operation, the current consumption of the temperature sensor circuit 40 can be significantly reduced as compared with the case where the temperature sensor circuit 40 performs a constant operation, and as a result, low power consumption of the circuit device 20 can be achieved.

However, when the temperature sensor circuit 40 performs the intermittent operation in this way, as will be described later in FIG. 10 and the like, the current consumption fluctuates in an AC manner, and the signal characteristics such as the jitter characteristics of the oscillation signal OSC deteriorate due to the AC fluctuation in the current consumption. Specifically, the AC fluctuation in the current consumption at the temperature sensor circuit 40 is propagated to the oscillation circuit as noise, and the signal characteristics such as the jitter characteristics of the oscillation signal OSC deteriorate. As a result, the signal characteristics of the clock signal CK based on the oscillation signal OSC deteriorate, and a situation occurs in which the output clock signal CKQ having deteriorated signal characteristics is output from the circuit device 20 and the oscillator 4.

For example, in JP-A-2015-90973 described above, although it prevents deterioration of the signal characteristics of the clock signal by separating the analog circuit region and the digital circuit region, there is no mention of the temperature sensor circuit, and the above problems caused by the intermittent operation of the temperature sensor circuit is not ascertained. For example, a temperature sensor circuit, which uses an analog voltage, is often used in a temperature compensated oscillation circuit in the related art, and there is almost no AC fluctuation in current consumption. However, when the temperature sensor circuit 40 is set to a digital configuration and is set so as to perform the intermittent operation as in the present embodiment, the AC fluctuation in the current consumption is large and the temperature sensor circuit 40 is a noise source, so that it is also necessary to consider the disposition of the temperature sensor circuit 40.

Therefore, in the present embodiment, a layout disposition method that increases a space between the temperature sensor circuit 40 or the like, which is a noise source generated by the AC fluctuation in the current consumption due to the intermittent operation, and the oscillation circuit 30, which has a small current consumption and is susceptible to noise, is adopted. Specifically, as illustrated in FIGS. 2 and 3, the logic circuit 50 or the power supply circuit 60 is disposed between the oscillation circuit 30, which is susceptible to noise, and the temperature sensor circuit 40, which is a noise source. For example, the logic circuit 50 is disposed between the oscillation circuit 30 and the temperature sensor circuit 40 in FIG. 2, and the power supply circuit 60 is disposed in FIG. 3. In this way, the logic circuit 50 or the power supply circuit 60 is interposed between the oscillation circuit 30 and the temperature sensor circuit 40. By interposing the logic circuit 50 or the power supply circuit 60 in this way, a distance between the oscillation circuit 30 and the temperature sensor circuit 40 is increased by at least the logic circuit 50 or the power supply circuit 60. As a result, the AC fluctuation in the current consumption due to the intermittent operation of the temperature sensor circuit 40 becomes noise, and it is possible to effectively reduce a situation in which an adverse effect is given to the oscillation operation of the oscillation circuit 30, and the signal characteristics such as the jitter characteristics of the oscillation signal OSC deteriorate.

Specifically, in the present embodiment, the influence of noise generated by the interference between the digital circuits and the analog circuits is reduced by separating the region of the analog circuit such as the oscillation circuit 30, which has a small current consumption and is susceptible to noise, and the regions of the digital circuits such as the temperature sensor circuit 40, the logic circuit 50, and the output buffer circuit 70, which have a large current consumption and generate noise. For example, by separately disposing the region of the analog circuit such as the oscillation circuit 30 or the power supply circuit 60, which performs a constant operation, and the region of the digital circuit such as the temperature sensor circuit 40, which performs the intermittent operation, the influence of noise generated by the interference between the circuit performing a constant operation and the circuit performing the intermittent operation is reduced. For example, among the digital circuits, by making the distance between the output buffer circuit 70, which has the largest current consumption and is a noise source, and the oscillation circuit 30, which has a small current consumption and is most susceptible to noise, as far apart as possible, the adverse effect of noise wraparound to the oscillation circuit 30 is reduced. Further, the temperature sensor circuit 40 includes the digital circuit that converts temperature information into a digital code and performs the intermittent operation for low current consumption so that the current consumption during the operation becomes a noise source to the oscillation circuit 30 in the order close to that of the output buffer circuit 70. Therefore, the oscillation circuit 30, and the temperature sensor circuit 40 and the output buffer circuit 70, which become noise sources, are separately disposed, and by disposing the logic circuit 50, which is less susceptible to noise than the oscillation circuit 30, or alternatively by disposing the power supply circuit 60, which is less susceptible to noise and operates in a DC manner, between the oscillation circuit 30, and the temperature sensor circuit 40 and the output buffer circuit 70, the noise wraparound to the oscillation circuit 30 is reduced.

Further, the temperature sensor circuit 40 performs the intermittent operation of obtaining the temperature data TSQ corresponding to the temperature during the operation period and stopping the operation of the temperature sensor circuit 40 after outputting the obtained temperature data TSQ to the logic circuit 50. For example, the temperature sensor circuit 40 enters the operation enable state during the operation period and obtains the temperature data TSQ. For example, in the temperature sensor circuit 40, during the operation period, the ring oscillator 42, the counter circuit 44, the regulator 46, and the like illustrated in FIG. 5 described later enter the operation enable state, and the temperature data TSQ corresponding to the temperature is obtained. Specifically, the regulated power supply voltage VREG3 from the regulator 46 is supplied with respect to each of these circuits, and the enable signal of each circuit described later becomes active so that the operation current flowing through each circuit is turned on and each circuit enters the operation enable state. Thereafter, the temperature sensor circuit 40 outputs the obtained temperature data TSQ to the logic circuit 50. That is, the temperature data TSQ corresponding to the temperature measured during the operation period is output to the logic circuit 50. Further, after the temperature data TSQ is output to the logic circuit 50, the temperature sensor circuit 40 enters, for example, the operation disable state, and stops the operation thereof. For example, during the stop period of the intermittent operation, the ring oscillator 42, the counter circuit 44, the regulator 46, and the like enter the operation disable state and stop the operation. Specifically, the regulated power supply voltage VREG3 from the regulator 46 is not supplied with respect to each of these circuits, and the enable signal of each circuit becomes inactive so that the operation current flowing through each circuit is turned off and each circuit enters the operation disable state. By stopping the operation of each circuit of the temperature sensor circuit 40, the power saving of the temperature sensor circuit 40 can be achieved. By performing the intermittent operation in which the temperature sensor circuit 40 repeats the operation period and the stop period in this way, low power consumption is realized. The length of the operation period of the temperature sensor circuit 40 in the intermittent operation is, for example, 50 ms or less, and the current consumption of the temperature sensor circuit 40 during the operation period is, for example, 10 µA or less. The time required for a start is shorter as compared with that of the band gap reference (BGR) circuit described later so that the ring oscillator 42 can start the appropriate oscillation operation even for a short operation period. Further, by shortening the operation period of the temperature sensor circuit 40 in this way, low power consumption can be realized. Specifically, the current consumption of the oscillation circuit 30 is, for example, substantially 100 to 200 nA, the current consumption of the logic circuit 50 is, for example, substantially 10 to 20 nA, and the current consumption of the power supply circuit 60 is, for example, substantially 100 nA. Even when the current consumption of the temperature sensor circuit 40 during the operation period is, for example, substantially 100 µA, by causing the temperature sensor circuit 40 to perform the intermittent operation, it is possible to reduce the current consumption of the temperature sensor circuit 40 on average for 1 second to substantially 2 nA.

However, when the intermittent operation, in which the operation period and the stop period are repeated, is performed, the AC fluctuation of the current consumption occurs as described above and there may be a possibility that this becomes noise and gives an adverse effect on the oscillation circuit 30. In this regard, in the present embodiment, as illustrated in FIGS. 2 and 3, the logic circuit 50 or the power supply circuit 60 is disposed between the oscillation circuit 30 and the temperature sensor circuit 40. As a result, the distance between the oscillation circuit 30 and the temperature sensor circuit can be increased. Therefore, even when the AC fluctuation in the current consumption due to such the intermittent operation occurs, the transmission of noise, which is generated by the fluctuation, to the oscillation circuit 30 is reduced, and the deterioration of the signal characteristics of the oscillation signal OSC can be reduced.

Further, as illustrated in FIG. 1, the logic circuit 50 has a latch circuit 52 that latches the temperature data TSQ output by the temperature sensor circuit 40 during the operation period. The latch circuit 52 can be realized by a holding circuit such as a flip-flop circuit or the like, for example. The logic circuit 50 performs the temperature compensation processing based on the temperature data TSQ latched by the latch circuit 52 even during the stop period of the temperature sensor circuit 40. That is, the temperature sensor circuit 40 obtains the temperature data TSQ corresponding to the temperature during the operation period, and the obtained temperature data TSQ is latched by the latch circuit 52 of the logic circuit 50. Therefore, even when the temperature sensor circuit 40 stops the operation thereof after outputting the obtained temperature data TSQ, the obtained temperature data TSQ is latched and held by the latch circuit 52 of the logic circuit 50. Therefore, even when the temperature sensor circuit 40 stops the operation in the stop period after the operation period of the intermittent operation, the logic circuit 50 can properly execute the temperature compensation processing based on the temperature data TSQ latched by the latch circuit 52. That is, the logic circuit 50 is operated by the regulated power supply voltage VREG2 supplied from the power supply circuit 60 which performs a constant operation, and then the temperature compensation processing can be executed.

Further, in FIG. 2, the oscillation circuit 30, the logic circuit 50, and the temperature sensor circuit 40 are disposed between the side SD1 of the circuit device 20 and the side SD2 which is an opposite side of the side SD1, in the order of the oscillation circuit 30, the logic circuit 50, and the temperature sensor circuit 40. For example, when the direction from the side SD1 toward the side SD2 is defined as DR1, the logic circuit 50 is disposed on the direction DR1 side of the oscillation circuit 30, and the temperature sensor circuit 40 is disposed on the direction DR1 side of the logic circuit 50. As an example, the oscillation circuit 30 and the logic circuit 50 are disposed next to each other along the direction DR1, and the logic circuit 50 and the temperature sensor circuit 40 are disposed next to each other along the direction DR1. Further, the temperature sensor circuit 40 is disposed along the side SD2 of the circuit device 20, for example. For example, the temperature sensor circuit 40 is disposed with a direction along the side SD2 as the longitudinal direction. When the oscillation circuit 30, the logic circuit 50, and the temperature sensor circuit 40 are disposed in this order, the logic circuit 50, which is a relatively large circuit block, is interposed between the oscillation circuit 30 and the temperature sensor circuit 40, and the transmission of noise, which is generated by the AC fluctuation in the current consumption from the temperature sensor circuit 40 that performs an intermittent operation, to the oscillation circuit 30 is reduced, and the deterioration of the signal characteristics of the oscillation signal OSC can be reduced. Further, the oscillation circuit 30, the logic circuit 50, and the temperature sensor circuit 40 can be efficiently laid out along the direction DR1 from the side SD1 toward the side SD2 of the circuit device 20, the length of the circuit device 20 in the direction DR1 can be shortened, and the layout area of the circuit device 20 can be reduced. Therefore, it is possible to realize both reducing deterioration of the signal characteristics of the oscillation signal OSC and reducing the area of the circuit device 20 at the same time.

Further, in FIG. 2, the power supply circuit 60 is disposed between the side SD1 of the circuit device 20 and the oscillation circuit 30. For example, the power supply circuit 60 and the oscillation circuit 30 are disposed along the direction DR1 from the side SD1 toward the side SD2 of the circuit device 20, in the order of the power supply circuit 60 and the oscillation circuit 30. For example, the power supply circuit 60 is disposed along the side SD1. Specifically, the power supply circuit 60 is disposed with the direction along the side SD1 as the longitudinal direction. The power supply circuit 60 and the oscillation circuit 30 are disposed next to each other along, for example, the direction DR1. In this way, the power supply circuit 60 and the oscillation circuit 30 can be efficiently laid out along the direction DR1 from the side SD1 toward the side SD2 of the circuit device 20 so that the length can be shortened in the direction DR1 of the circuit device 20, and the circuit area of the circuit device 20 can be reduced. For example, in FIG. 2, the power supply circuit 60, the oscillation circuit 30, the logic circuit 50, and the temperature sensor circuit 40 are disposed next to each other along the direction DR1 so that the length is minimized in the direction DR1 of the circuit device 20, and the area of the circuit device 20 can be reduced. In particular, since the power supply circuit 60, the oscillation circuit 30, the logic circuit 50, and the temperature sensor circuit 40 are circuit blocks having the direction DR3 orthogonal to the direction DR1 as the long side direction, by disposing these circuit blocks in order along the direction DR1, the area of the circuit device 20 can be reduced. Note that, the fact that the first circuit block and the second circuit block are disposed next to each other means that, for example, the first circuit block and the second circuit block are disposed without any other circuit block intervening therebetween.

On the other hand, in FIG. 3, the temperature sensor circuit 40, the power supply circuit 60, and the oscillation circuit 30 are disposed between the side SD1 and the side SD2 of the circuit device 20, in the order of the temperature sensor circuit 40, the power supply circuit 60, and the oscillation circuit 30. For example, when a direction from the side SD1 toward the side SD2 is defined as DR1, the power supply circuit 60 is disposed on the direction DR1 side of the temperature sensor circuit 40, and the oscillation circuit 30 is disposed on the direction DR1 side of the power supply circuit 60. As an example, the temperature sensor circuit 40 and the power supply circuit 60 are disposed next to each other along the direction DR1, and the power supply circuit 60 and the oscillation circuit 30 are disposed next to each other along the direction DR1. Further, the temperature sensor circuit 40 is disposed along the side SD1 of the circuit device 20, for example. For example, the temperature sensor circuit 40 is disposed with a direction along the side SD1 as the longitudinal direction. When the temperature sensor circuit 40, the power supply circuit 60, and the oscillation circuit 30 are disposed in this order, the power supply circuit 60, which is a relatively large circuit block, is interposed between the temperature sensor circuit 40 and the oscillation circuit 30, and the transmission of noise, which is generated by the AC fluctuation in the current consumption from the temperature sensor circuit 40 that performs the intermittent operation, to the oscillation circuit 30 is reduced, and the deterioration of the signal characteristics of the oscillation signal OSC can be reduced. Further, the temperature sensor circuit 40, the power supply circuit 60, and the oscillation circuit 30 can be efficiently laid out along the direction DR1 from the side SD1 toward the side SD2 of the circuit device 20, the length of the circuit device 20 in the direction DR1 can be shortened, and the layout area of the circuit device 20 can be reduced. Therefore, it is possible to realize both reducing deterioration of the signal characteristics of the oscillation signal OSC and reducing the area of the circuit device 20 at the same time.

Further, in FIG. 3, the logic circuit 50 is disposed between the oscillation circuit 30 and the side SD2. For example, the oscillation circuit 30 and the logic circuit 50 are disposed along the direction DR1 from the side SD1 toward the side SD2 of the circuit device 20 in the order of the oscillation circuit 30 and logic circuit 50. For example, the logic circuit 50 is disposed along the side SD2. Specifically, the logic circuit 50 is disposed with the direction along the side SD2 as the longitudinal direction. The oscillation circuit 30 and the logic circuit 50 are disposed next to each other along the direction DR1, for example. In this way, the oscillation circuit 30 and the logic circuit 50 can be efficiently laid out along the direction DR1 from the side SD1 toward the side SD2 of the circuit device 20 so that the length can be shortened in the direction DR1 of the circuit device 20, and the circuit area of the circuit device 20 can be reduced. For example, in FIG. 3, the temperature sensor circuit 40, the power supply circuit 60, the oscillation circuit 30, and the logic circuit 50 are disposed next to each other along the direction DR1 so that the length is minimized in the direction DR1 of the circuit device 20, and the area of the circuit device 20 can be reduced. In particular, since the temperature sensor circuit 40, the power supply circuit 60, the oscillation circuit 30, and the logic circuit 50 are circuit blocks having the direction DR3 orthogonal to the direction DR1 as the long side direction, by disposing these circuit blocks in order along the direction DR1, the area of the circuit device 20 can be reduced.

In FIGS. 2 and 3, the circuit device 20 includes a terminal TX1 coupled to one end of the vibrator 10, and a terminal TX2 coupled to the other end of the vibrator 10. That is, the circuit device 20 includes the terminal TX1 which is the first terminal and the terminal TX2 which is the second terminal for electrically coupling the circuit device 20 to the vibrator 10. Further, the circuit device 20 includes a power supply terminal TVDD to which a power supply voltage is input and a ground terminal TGND to which a ground voltage GND is input. That is, the circuit device 20 includes the power supply terminal TVDD for supplying VDD, which is an external power supply voltage, from an external power supply device, and a ground terminal TGND for supplying GND, which is also called VSS. Further, as illustrated in FIGS. 2 and 3, the terminal TX1 and the ground terminal TGND are disposed along the side SD1 and the side SD3, which intersects the side SD2, of the circuit device 20. For example, the terminal TX1 is disposed in the vicinity of the center of the side SD3, and the ground terminal TGND is disposed on the DR1 side in the direction of the terminal TX1. For example, the terminal TX1 and the ground terminal TGND are disposed so as to interpose a part of the logic circuit 50 or the electrostatic protection circuit therebetween. Further, the power supply terminal TVDD and the terminal TX2 are disposed along the side SD4 which is an opposite side of the side SD3 of the circuit device 20. For example, the terminal TX2 is disposed in the vicinity of the center of the side SD4, and when the direction opposite to the direction DR1 is defined as DR2, the power supply terminal TVDD is disposed on the direction DR2 side of the terminal TX2. For example, the terminal TX2 and the power supply terminal TVDD are disposed so as to interpose a part of the oscillation circuit 30 or the electrostatic protection circuit therebetween. In this way, for example, as illustrated in FIGS. 2 and 3, in the layout disposition in which the logic circuit 50 or the power supply circuit 60 is disposed between the oscillation circuit 30 and the temperature sensor circuit 40, the terminal TX1 that is coupled to one end of the vibrator 10 can be disposed near the oscillation circuit 30 on the side SD3, and a terminal TX2 that is coupled to the other end of the vibrator 10 can be disposed near the oscillation circuit 30 on the side SD4. Further, the ground terminal TGND can be disposed along the side SD3 together with the terminal TX1, and the power supply terminal TVDD can be disposed along the side SD4 together with the terminal TX2. As a result, for example, the disposition of the terminals of the circuit device 20 suitable for the oscillator 4 of a first structural example illustrated in FIGS. 18, 19, and 20 described later can be realized.

Figure 4:
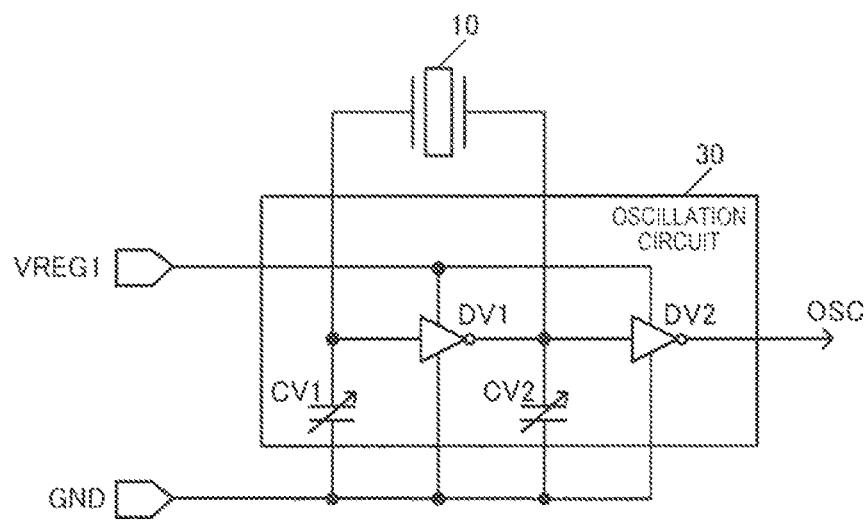
FIG. 4 illustrates an example of a configuration of an oscillation circuit.

In FIGS. 2 and 3, the variable capacitance circuit CV1, which will be described later, in FIG. 4 is disposed in a region of the oscillation circuit 30 on the terminal TX1 side, and the variable capacitance circuit CV2 is disposed in a region of the oscillation circuit 30 on the terminal TX2 side. For example, the variable capacitance circuit CV1 of the oscillation circuit 30 and the terminal TX1 coupled to the variable capacitance circuit CV1 are disposed next to each other, and the variable capacitance circuit CV2 of the oscillation circuit 30 and the terminal TX2 coupled to the variable capacitance circuit CV2 are disposed next to each other. In this way, the terminals TX1 and TX2, and the variable capacitance circuits CV1 and CV2 can be coupled with a short path route, and adverse effects caused by the parasitic capacitance or the parasitic resistance in the route can be reduced. For example, the area of the variable capacitance circuit CV1, which is constituted by a first capacitor array and the like, and the area of the variable capacitance circuit CV2, which is constituted by a second capacitor array and the like, occupy most of the layout area of the oscillation circuit 30. Therefore, by disposing the variable capacitance circuit CV1 closer to the side SD3 side in the oscillation circuit 30, the variable capacitance circuit CV1 and the terminal TX1, which is disposed on the side SD3, can be coupled with a short path route. Therefore, by disposing the variable capacitance circuit CV2 closer to the side SD4 side in the oscillation circuit 30, the variable capacitance circuit CV2 and the terminal TX2, which is disposed on the side SD4, can be coupled with a short path route.

Further, in FIGS. 2 and 3, the power supply terminal TVDD is disposed at a first corner portion in which the side SD1 and the side SD4 intersect. Further, the ground terminal TGND is disposed at a second corner portion in which the side SD2 and the side SD3 intersect. That is, the power supply terminal TVDD is disposed at the first corner portion, which is a region where the side SD1 and the side SD4 intersect, and the ground terminal TGND is disposed at the second corner portion, which is a region where the side SD2 and the side SD3 intersect and which faces the first corner portion. That is, in the semiconductor chip of the rectangular circuit device 20, the power supply terminal TVDD and the ground terminal TGND are diagonally disposed. The ground terminal TGND disposed at the second corner portion and the terminal TX1 coupled to one end of the vibrator 10 are disposed along the side SD3. Further, the power supply terminal TVDD disposed at the first corner portion and the terminal TX2 coupled to the other end of the vibrator 10 are disposed along the side SD4. Therefore, the terminal TX1 and the ground terminal TGND can be efficiently disposed along the side SD3, and the terminal TX2 and the power supply terminal TVDD can be efficiently disposed along the side SD4 so that efficient layout disposition of the oscillation circuit 30, the temperature sensor circuit 40, the logic circuit 50, and the power supply circuit 60 is also possible. Thereby, the disposition of the terminals of the circuit device 20 suitable for the oscillator 4 of a first structural example illustrated in FIGS. 18, 19, and 20 described later can be realized.

The circuit device 20 also includes the clock terminal TCK to which the output clock signal CKQ based on the oscillation signal OSC is output. Further, as illustrated in FIGS. 2 and 3, the clock terminal TCK is disposed at a third corner portion in which the side SD2 and the side SD4 intersect. That is, the clock terminal TCK is disposed at the third corner portion, which is a region on the direction DR1 side of the first corner portion in which the power supply terminal TVDD is disposed, and is a region on the direction DR3 side of the second corner portion in which the ground terminal TGND is disposed. In this way, the clock terminal TCK, which is a noise source, or the output buffer circuit 70, which outputs the output clock signal CKQ to the clock terminal TCK, can be disposed at the third corner portion in which the side SD2 and the side SD4 intersect. Therefore, a distance between the noise source generated by the output clock signal CKQ of the clock terminal TCK and the oscillation circuit 30 can be increased as much as possible, and the transmission of noise, which is generated by the noise source, to the oscillation circuit 30 can be further reduced.

The circuit device 20 includes the power supply terminal TVDD to which the power supply voltage VDD is input, and as illustrated in FIGS. 2 and 3, the power supply circuit 60 is disposed between the power supply terminal TVDD and the oscillation circuit 30. For example, the power supply terminal TVDD, the power supply circuit 60, and the oscillation circuit 30 are disposed so that the power supply circuit 60 is positioned on a line connecting the position of the power supply terminal TVDD and the position of the oscillation circuit 30. Specifically, the power supply circuit 60 is disposed so as to be positioned next to the power supply terminal TVDD, and the oscillation circuit 30 is disposed so as to be positioned next to the power supply circuit 60. For example, in FIG. 2, the power supply circuit 60 is disposed on the direction DR4 side of the power supply terminal TVDD, and the oscillation circuit 30 is disposed on the direction DR1 side of the power supply circuit 60. Further, in FIG. 3, when a direction from the power supply terminal TVDD toward the ground terminal TGND is defined as DR5, the power supply circuit 60 is disposed on the direction DR5 side of the power supply terminal TVDD, and the oscillation circuit 30 is disposed on the direction DR5 side or the direction DR1 side of the power supply circuit 60. When the power supply circuit 60 is disposed between the power supply terminal TVDD and the oscillation circuit 30 in this way, the power supply voltage VDD is supplied to the power supply circuit 60 from the power supply terminal TVDD with a short path route, and the power supply circuit 60 can supply power with respect to the oscillation circuit 30 with a short path route based on the supplied power supply voltage VDD. For example, the regulator 61 of the power supply circuit 60 in FIG. 1 generates a regulated power supply voltage VREG1 based on the power supply voltage VDD supplied from the power supply terminal TVDD with a short path route, and can supply the generated regulated power supply voltage VREG1 to the oscillation circuit 30 with the short path route. Therefore, it is possible to reduce deterioration of the power supply characteristics due to the parasitic resistance of the route or the like, and supply appropriate power based on the power supply voltage VDD from the power supply terminal TVDD to the oscillation circuit 30.

The circuit device 20 also includes the output buffer circuit 70 that outputs the output clock signal CKQ based on the oscillation signal OSC, and the clock terminal TCK that outputs the output clock signal CKQ. For example, the output buffer circuit 70 outputs a signal obtained by buffering the clock signal CK based on the oscillation signal OSC to the clock terminal TCK as the output clock signal CKQ. Further, as illustrated in FIGS. 2 and 3, the output buffer circuit 70 is disposed between the clock terminal TCK and the logic circuit 50. For example, the clock terminal TCK, the output buffer circuit 70, and the logic circuit 50 are disposed so that the output buffer circuit 70 is positioned on the line connecting the position of the clock terminal TCK and the position of the logic circuit 50. Specifically, the output buffer circuit 70 is disposed so as to be positioned next to the logic circuit 50, and the clock terminal TCK is disposed so as to be positioned next to the output buffer circuit 70. In this way, the clock signal CK, which is output by the logic circuit 50 based on the oscillation signal OSC, is input to the output buffer circuit 70 with a short path route and buffered, and is output from the clock terminal TCK as the output clock signal CKQ. As a result, it becomes possible to reduce deterioration of the signal characteristics of the output clock signal CKQ caused by the parasitic resistance and the parasitic capacitor in the route.

2. Oscillation Circuit and Temperature Sensor Circuit

Next, an example of a configuration of the oscillation circuit 30 and the temperature sensor circuit 40 will be described. FIG. 4 illustrates an example of a configuration of the oscillation circuit 30. Note that the oscillation circuit 30 of the present embodiment is not limited to the configuration illustrated in FIG. 4, and some of the components may be omitted, other components may be added, or various modifications can be made, such as changing the component to another type of component.

As illustrated in FIG. 4, the oscillation circuit includes inverter circuits DV1 and DV2 and variable capacitance circuits CV1 and CV2. The inverter circuit DV1 is a drive circuit of the vibrator 10, an input node thereof is coupled to one end of the vibrator 10, and an output node thereof is coupled to the other end of the vibrator 10. The inverter circuit DV2 buffers the output signal of the inverter circuit DV1 and outputs the output signal as an oscillation signal OSC. The inverter circuits DV1 and DV2 are supplied with the VREG1 as a power supply voltage on the high potential side, supplied with the GND as a power supply voltage on the low potential side, and operated.

One end of the variable capacitance circuit CV1 is coupled to one end of the vibrator 10 and the other end thereof is coupled to the GND node. Specifically, the variable capacitance circuit CV1 includes a first capacitor array, in which one end thereof is coupled to one end of the vibrator 10, and a first switch array, in which one end thereof is coupled to the other end of the first capacitor array and the other end thereof is coupled to the GND node. The capacitance value of the variable capacitance circuit CV1 is adjusted by controlling the ON/OFF of the plurality of switches of the first switch array by using the frequency control data generated based on the temperature data TSQ. Similarly, one end of the variable capacitance circuit CV2 is coupled to the other end of the vibrator 10 and the other end thereof is coupled to the GND node. Specifically, the variable capacitance circuit CV2 includes a second capacitor array, in which one end thereof is coupled to the other end of the vibrator 10, and a second switch array, in which one end thereof is coupled to the other end of the second capacitor array and the other end thereof is coupled to the GND node. Further, the capacitance value of the variable capacitance circuit CV2 is adjusted by controlling the ON/OFF of the plurality of switches of the second switch array by using the frequency control data generated based on the temperature data TSQ. By adjusting the capacitance values of the variable capacitance circuits CV1 and CV2 in this way, the oscillation frequency of the oscillation signal OSC of the oscillation circuit 30 is controlled, and the temperature compensation processing for the oscillation frequency is realized.

FIG. 5 illustrates an example of a configuration of the temperature sensor circuit 40. Note that the temperature sensor circuit 40 of the present embodiment is not limited to the configuration illustrated in FIG. 5, and some of the components may be omitted, other components may be added, or various modifications can be made, such as changing the component to another type of component.

Figure 6:
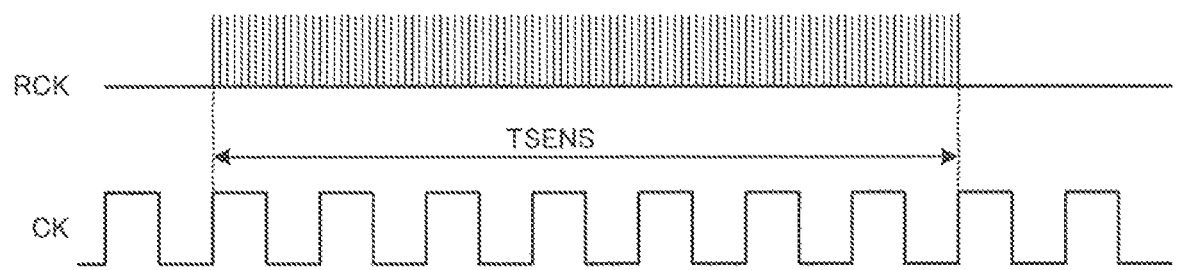
FIG. 6 is an explanatory view of an operation of the temperature sensor circuit.
Figure 11:
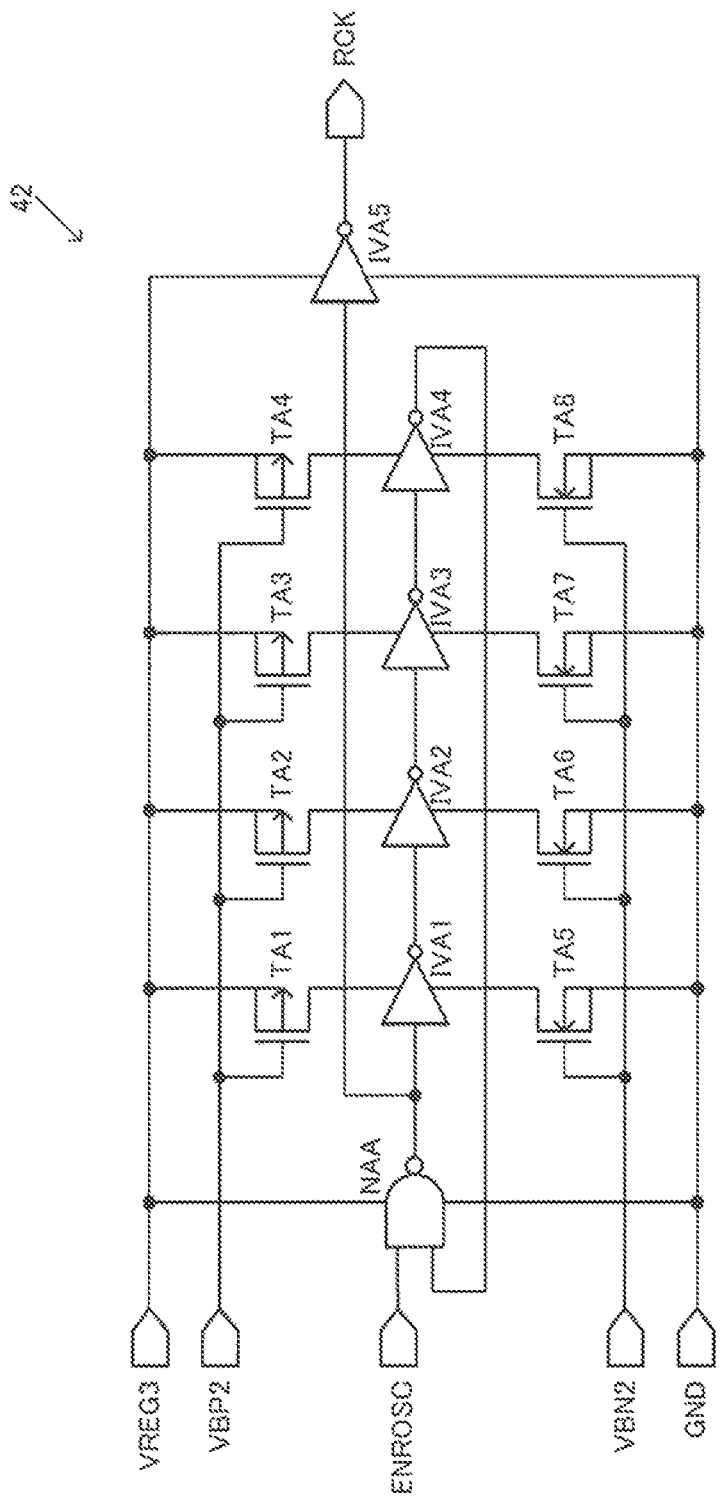
FIG. 11 illustrates an example of a configuration of a ring oscillator.

The temperature sensor circuit 40 includes a ring oscillator 42, a counter circuit 44, and a regulator 46. The ring oscillator 42 is a circuit in which a plurality of delay elements are coupled in a ring shape. Specifically, the ring oscillator 42 is a circuit in which signal inversion circuits such as an odd number of inverter circuits are coupled in a ring shape, as illustrated in FIG. 11 described later, and outputs an output pulse signal RCK which is an oscillation signal. The counter circuit 44 performs count processing of the number of pulses of the output pulse signal RCK for the ring oscillator 42 by using the clock signal CK based on the oscillation signal OSC. Thereafter, the temperature data TSQ based on the count value obtained by the count processing is output. For example, as illustrated in FIG. 6, the counter circuit 44 obtains the temperature data TSQ by obtaining the count value of the number of pulses of the output pulse signal RCK in a count period TSENS that is defined by the clock signal CK. For example, in FIG. 6, the count period TSENS is a period corresponding to m=7 clocks of the clock signal CK. The counter circuit 44 counts the number of pulses of the output pulse signal RCK during the count period TSENS. The regulator 46 supplies the regulated power supply voltage VREG3 to the ring oscillator 42. In FIG. 5, the regulator 46 also supplies the regulated power supply voltage VREG3 to the current setting circuit 48 and the counter circuit 44. For example, the regulator 46 generates the regulated power supply voltage VREG3 by regulating the power supply voltage VDD. For example, as illustrated in FIG. 5, the regulator 46 has an operational amplifier OPB, and resistors RB1 and RB2. The regulated power supply voltage VREG3 is generated by using the reference voltage generated by the difference in work function WF of an operational amplifier OPB. According to the configuration in FIG. 5, the temperature sensor circuit 40 capable of performing a low voltage operation with low power consumption can be realized by using a small-scale circuit.

As illustrated in FIG. 5, the temperature sensor circuit 40 includes the current setting circuit 48. The current setting circuit 48 operates based on the regulated power supply voltage VREG3 generated by the regulator 46 and sets the operation current of the ring oscillator 42. For example, the current setting circuit 48 generates bias voltages VBP2 and VBN2 for setting the operation current flowing through the inverter circuits IVA1, IVA2, IVA3, and IVA4 of the regulator 46 illustrated in FIG. 11, which will be described later. This operation current can also be called a bias current based on the bias voltages VBP2 and VBN2. By providing such a current setting circuit 48 and setting the operation current of the ring oscillator 42, the oscillation frequency of the ring oscillator 42 can be controlled. For example, the current setting circuit 48 sets the operation current, which is a bias current of the regulator 46 so that a current value increases as the temperature increases. In this way, it is possible to realize frequency control in which the oscillation frequency of the ring oscillator 42 increases as the temperature increases.

Figure 7:
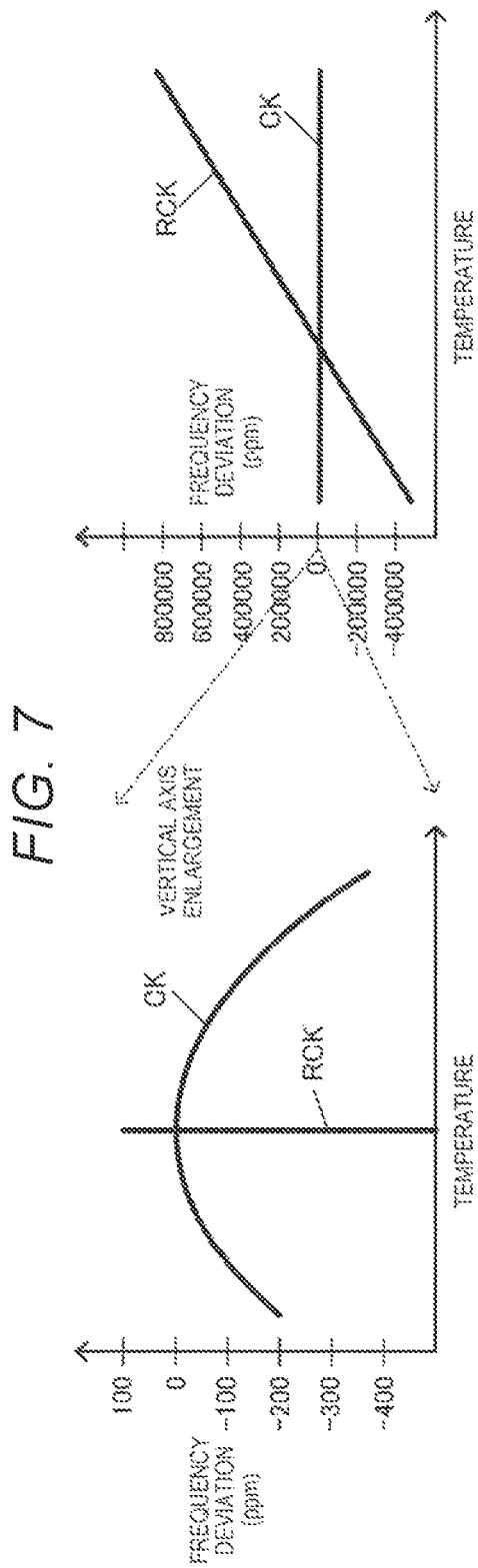
FIG. 7 illustrates an example of characteristics of frequency deviation of a clock signal and an output pulse signal with respect to temperature.

For example, FIG. 7 illustrates an example of characteristics of frequency deviation of the clock signal CK and the output pulse signal RCK with respect to the temperature. In FIG. 7, an example of the characteristics on the left side is an enlarged example of the vertical axis of an example of the characteristics on the right side. As illustrated in the example of the characteristics on the right side in FIG. 7, the frequency of the output pulse signal RCK, which is the oscillation frequency of the ring oscillator 42, increases as the temperature increases. This is realized by controlling the operation current of the ring oscillator 42 by the current setting circuit 48.

For example, an oscillator having a relatively low frequency such as 32 KHz is required to have low power consumption, low voltage operation, and miniaturization for sensor-related applications such as the Internet of things (IoT). However, the temperature sensor circuit in the related art has a problem that it is difficult to achieve both low current consumption and low voltage operation and to configure a small-sized temperature sensor circuit. For example, a high accuracy oscillator with a built-in temperature control function requires the temperature sensor circuit. However, when the temperature sensor circuit is constituted by a band gap reference (BGR) circuit and an A/D conversion circuit, it is difficult to achieve low current consumption or low voltage operation. For example, in order to generate a voltage proportional to the temperature, it is necessary to pass a certain amount or more of current through the bipolar transistor of the BGR circuit, and it is difficult to achieve low power consumption. Further, in order to increase the resolution of temperature detection, a dynamic range of the voltage input to the A/D conversion circuit is required so that it is difficult to achieve low voltage operation. Further, the capacitance DAC type A/D conversion circuit has a large capacitance area, and it is difficult to achieve miniaturization in order to ensure accuracy.

In FIG. 5, a frequency comparison type temperature sensor circuit 40 is used. That is, the temperature sensor circuit 40 is constituted by the built-in ring oscillator 42 whose oscillation frequency depends on the temperature, and the counter circuit 44 for counting the output pulse signal RCK of the ring oscillator 42. The ring oscillator 42 is an oscillation circuit controlled by a bias current depending on the temperature. Further, the reference clock signal of the counter circuit 44 is, for example, a clock signal CK of 32 KHz, which is the oscillation frequency of the oscillation circuit 30. Thereby, the current consumption is reduced by making the temperature sensor circuit 40 perform the intermittent operation, and preventing the signal of the count value in the counter circuit 44 from being transmitted to the logic circuit 50 during the count period TSENS.

Further, in order to reduce noise to be sneaking into circuits other than the temperature sensor circuit 40 due to the intermittent operation of the temperature sensor circuit 40, the power supply voltage of the temperature sensor circuit 40 uses the regulated power supply voltage VREG3 that is generated by the dedicated regulator 46. For example, the regulators 61 and 62 in FIG. 1 that generate the regulated power supply voltages VREG1 and VREG2 supplied to the oscillation circuit 30 and the logic circuit 50, are disposed in a region of the power supply circuit 60 in FIGS. 2 and 3. In contrast to this, the regulator 46 in FIG. 5 that generates the regulated power supply voltage VREG3 supplied to the temperature sensor circuit 40, is disposed in a region of the temperature sensor circuit 40 in FIGS. 2 and 3.

Since the count period TSENS illustrated in FIG. 6 is variable by setting a register provided in the logic circuit 50, for example, the resolution which is the sensitivity of temperature detection can be customized according to the specifications. Further, in FIG. 5, the configuration is such that the frequencies are compared by the counter circuit 44 so that the BGR circuit and the A/D conversion circuit are not required, and the current consumption and the circuit scale can be reduced. Further, since the ring oscillator 42 and the counter circuit 44 operate even with a low power supply voltage of, for example, substantially 1.2 V, the lower limit voltage for operation can be low, and since the resolution of temperature detection can be ensured by lengthening the count period TSENS, the resolution can also be ensured. Further, although there are individual differences in the frequency of the ring oscillator 42, by adjusting the logic circuit 50 provided in the subsequent stage of the counter circuit 44, it becomes possible to correspond to an address range of the lookup table for temperature compensation.

Figure 8:
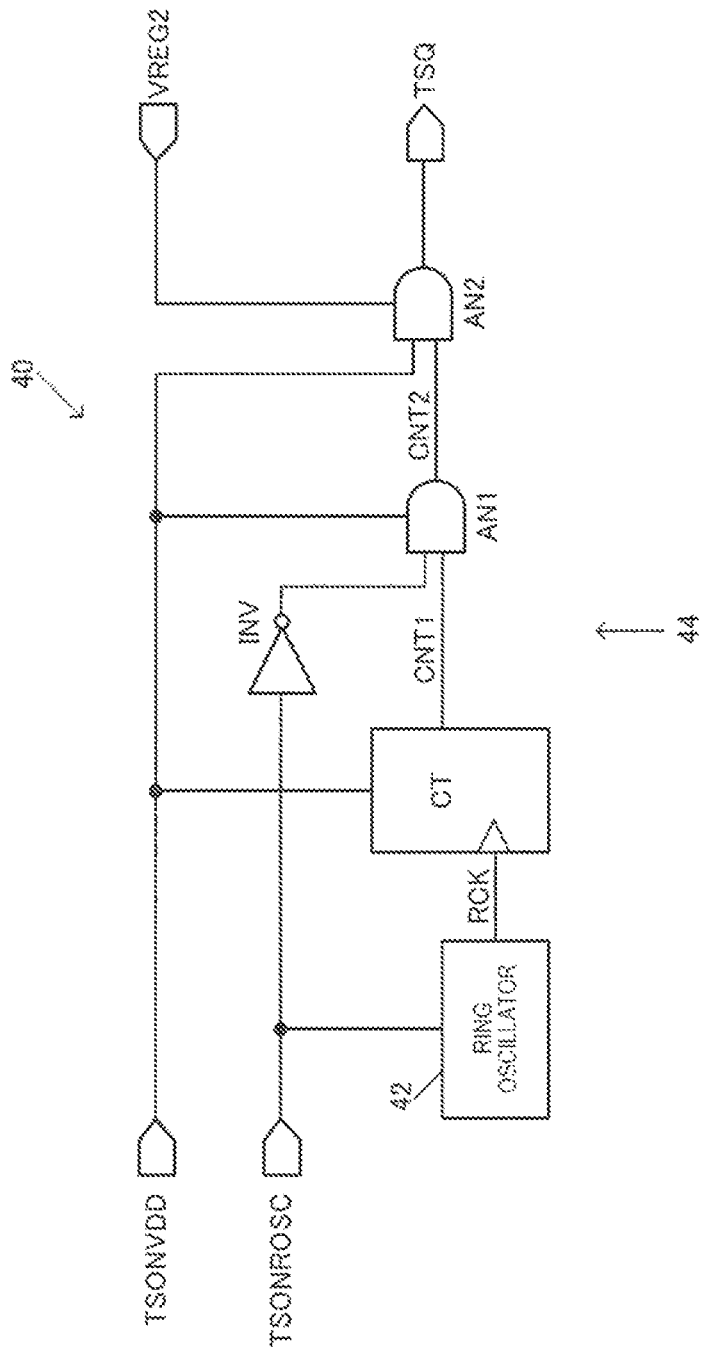
FIG. 8 illustrates a detailed example of a configuration of a counter circuit.
Figure 9:
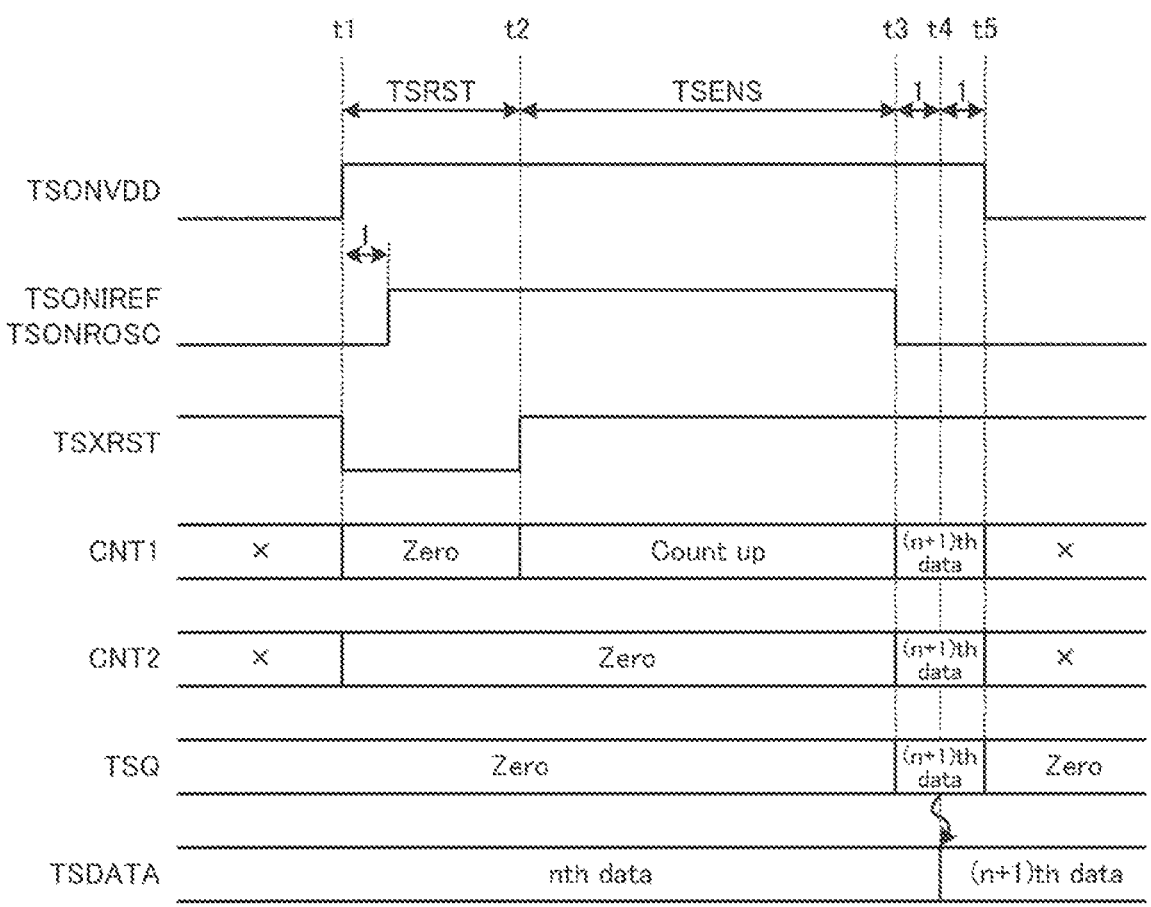
FIG. 9 is a detailed explanatory view of an operation of the temperature sensor circuit.

FIGS. 8 and 9 are detailed explanatory views of an operation of the temperature sensor circuit 40. FIG. 8 schematically illustrates an example of a detailed configuration of the counter circuit 44, and FIG. 9 illustrates a view of a signal waveform describing the circuit operation in FIG. 8. First, at a timing t1 in FIG. 9, the signal TSONVDD becomes a high level which is an active level, the regulator 46 is started, and the regulated power supply voltage VREG3 is activated. Further, a negative logic reset signal TSXRST becomes a low level which is an active level, the counter circuit 44 becomes a reset state, and a count value CNT1 of the counter CT becomes zero. A count value CNT2 output by the AND circuit AN1 to which the count value CNT1 is input also becomes zero. Next, the signals TSONROSC and TSONIREF become a high level after one cycle of the clock signal CK from the timing t1, and the ring oscillator 42 and the current setting circuit 48 is started. Thereafter, when the signal TSONROSC becomes a high level, the signal of the count value CNT2 which is the output of the AND circuit AN1 to which the inverted signal of this high level signal is input, is fixed to a low level. As a result, the signals of the count values CNT1 and CNT2 during the count period TSENS of the counter CT are not transmitted to the logic circuit 50, and low power consumption can be achieved.

Next, the count processing for the counter CT is started at a timing t2 after the lapse of the period TSRST from the timing t1. For example, it takes a certain amount of time from when the signal TSONROSC becomes a high level and the ring oscillator 42 is started until the oscillation frequency stabilizes. Therefore, the period TSRST for ensuring the time is set, and after the period TSRST elapses from the timing t1, the counter CT starts the count processing for the number of pulses of the output pulse signal RCK from the ring oscillator 42. The length of the period TSRST can be set by a register. As described in FIG. 6, during the count period TSENS, which is a period of the length of m clocks (m is an integer of 2 or more) of the clock signal CK, the counter CT performs the count processing for the number of pulses of the output pulse signal RCK and outputs the result of the count processing as the count value CNT1. Thereafter, the count processing is ended at a timing t3, and the count value CNT1 at that time is output to the logic circuit 50 as the temperature data TSQ via the AND circuit AN1 and the AND circuit AN2. At a timing t4, the latch circuit 52 of the logic circuit 50 latches the temperature data TSQ from the temperature sensor circuit 40. As a result, the temperature data TSDATA that is held in the latch circuit 52 is updated from the n-th temperature data to the next (n+1)-th temperature data. Thereafter, the logic circuit 50 performs the temperature compensation processing for the oscillation frequency based on the temperature data TSDATA held in the latch circuit 52.

Figure 10:
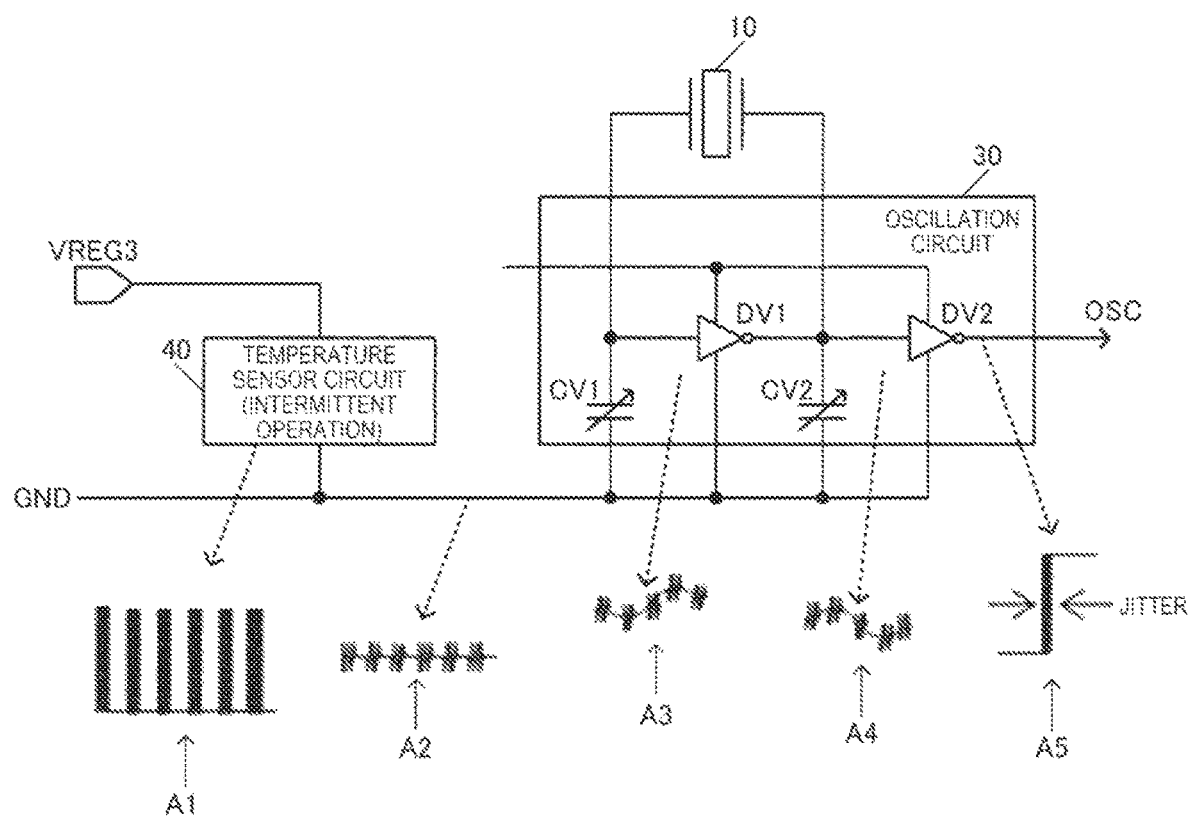
FIG. 10 is an explanatory view of deterioration of signal characteristics of an oscillation signal generated due to an intermittent operation.

FIG. 10 is an explanatory view of deterioration of signal characteristics of the oscillation signal OSC generated due to the intermittent operation of the temperature sensor circuit 40. When the temperature sensor circuit 40 performs the intermittent operation, as illustrated in A1 in FIG. 10, a situation occurs in which the current consumption of the temperature sensor circuit fluctuates in an AC manner. As a result, noise is generated on the ground line to which GND is supplied as illustrated in A2, and the noise is superimposed with respect to the signal in the oscillation circuit 30 as illustrated in A3 and A4. As a result, as illustrated in A5, jitter is generated in the oscillation signal OSC output from the oscillation circuit 30, the signal quality of the oscillation signal OSC deteriorates, and the signal characteristics of the clock signal CK also deteriorate. In this case, in the present embodiment, as illustrated in FIGS. 2 and 3, since a distance between the temperature sensor circuit 40, which performs the intermittent operation, and the oscillation circuit 30 can be increased, the generation of such jitter can be reduced.

FIG. 11 illustrates an example of a configuration of a ring oscillator 42. The ring oscillator 42 includes a NAND circuit NAA, inverter circuits IVA1, IVA2, IVA3, and IVA4 coupled in a ring shape. An inverter circuit IVA5, which is a buffer circuit, is also included. By coupling these odd number of signal inversion circuits in a ring shape, it is possible to generate the output pulse signal RCK which is the oscillation signal. Note that an enable signal ENROSC for enabling or disabling the operation of the ring oscillator 42 is input to the NAND circuit NAA. When the enable signal ENROSC is activated or deactivated by the logic circuit 50, the intermittent operation of the ring oscillator 42 is performed, and the intermittent operation of the temperature sensor circuit 40 is realized. Further, P-type transistors TA1, TA2, TA3, and TA4 for passing an operation current are provided on the VREG3 side of the inverter circuits IVA1, IVA2, IVA3, and IVA4, and N-type transistors TA5, TA6, TA7, and TA8 are provided on the GND side. Further, the bias voltage VBP2 from the current setting circuit 48 is input to the gates of the transistors TA1 to TA4, and the bias voltage VBN2 from the current setting circuit 48 is input to the gates of the transistors TA5 to TA8. As a result, the operation current of the ring oscillator 42 is controlled, and the ring oscillator 42 can output the output pulse signal RCK whose frequency increases as the temperature increases, for example.

Figure 12:
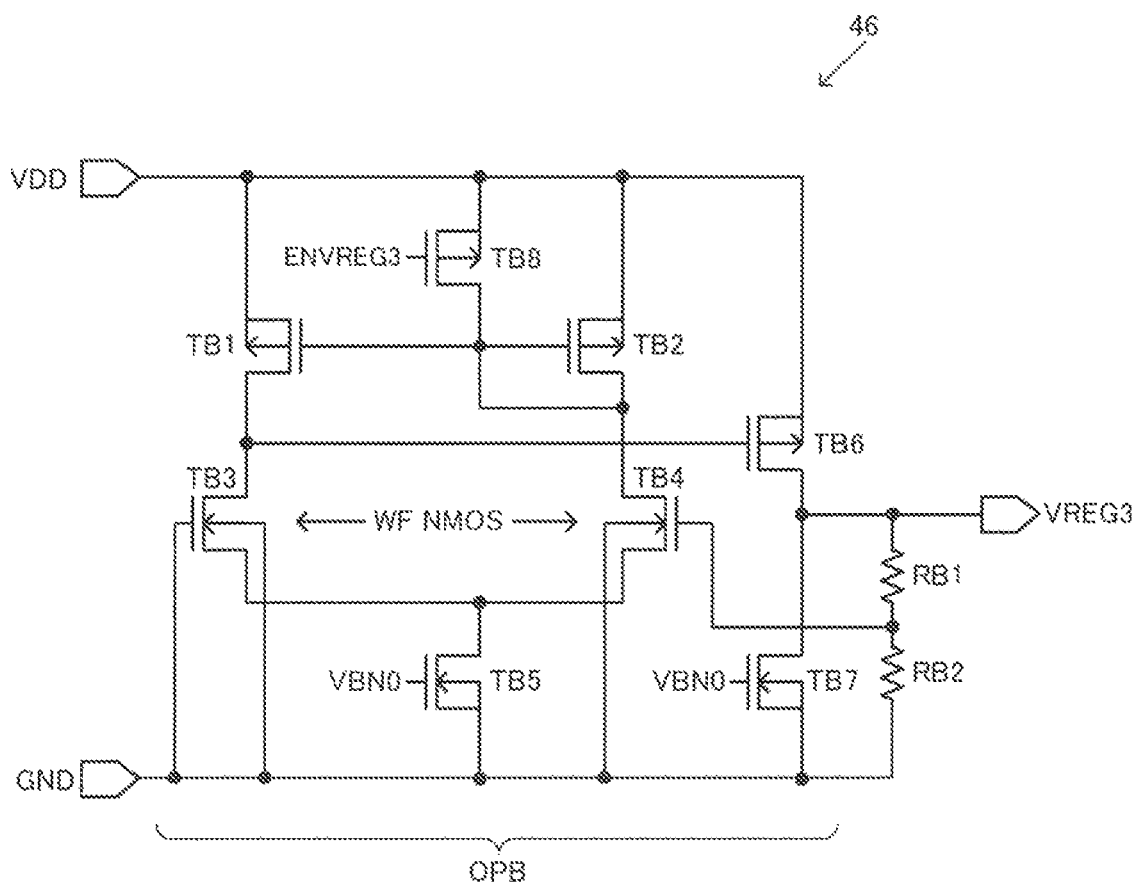
FIG. 12 illustrates an example of a configuration of a regulator.

FIG. 12 illustrates an example of a configuration of a regulator 46. Note that, the regulators 61 and 62 in FIG. 1 can also be realized by the same circuit configuration as that of FIG. 12. As illustrated in FIG. 12, the regulator 46 includes the operational amplifier OPB, and the resistors RB1 and RB2. The operational amplifier OPB has a differential portion constituted by the transistors TB1, TB2, TB3, TB4, and TB5, and an output portion constituted by the transistors TB6 and TB7. Note that, an enable signal ENVREG3 for enabling or disabling the operation of the regulator 46 is input to the transistor TB8. When the enable signal ENVREG3 is activated or deactivated by the logic circuit 50, the intermittent operation of the regulator 46 is performed, and the intermittent operation of the temperature sensor circuit 40 is realized. In FIG. 12, the regulated power supply voltage VREG3 is generated by utilizing the difference in work function WF of the N-type transistors TB3 and TB4 constituting a differential pair. For example, the voltage of VREG3 is set based on the voltage of the difference in work function WF and the resistance values of the resistors RB1 and RB2.

Figure 13:
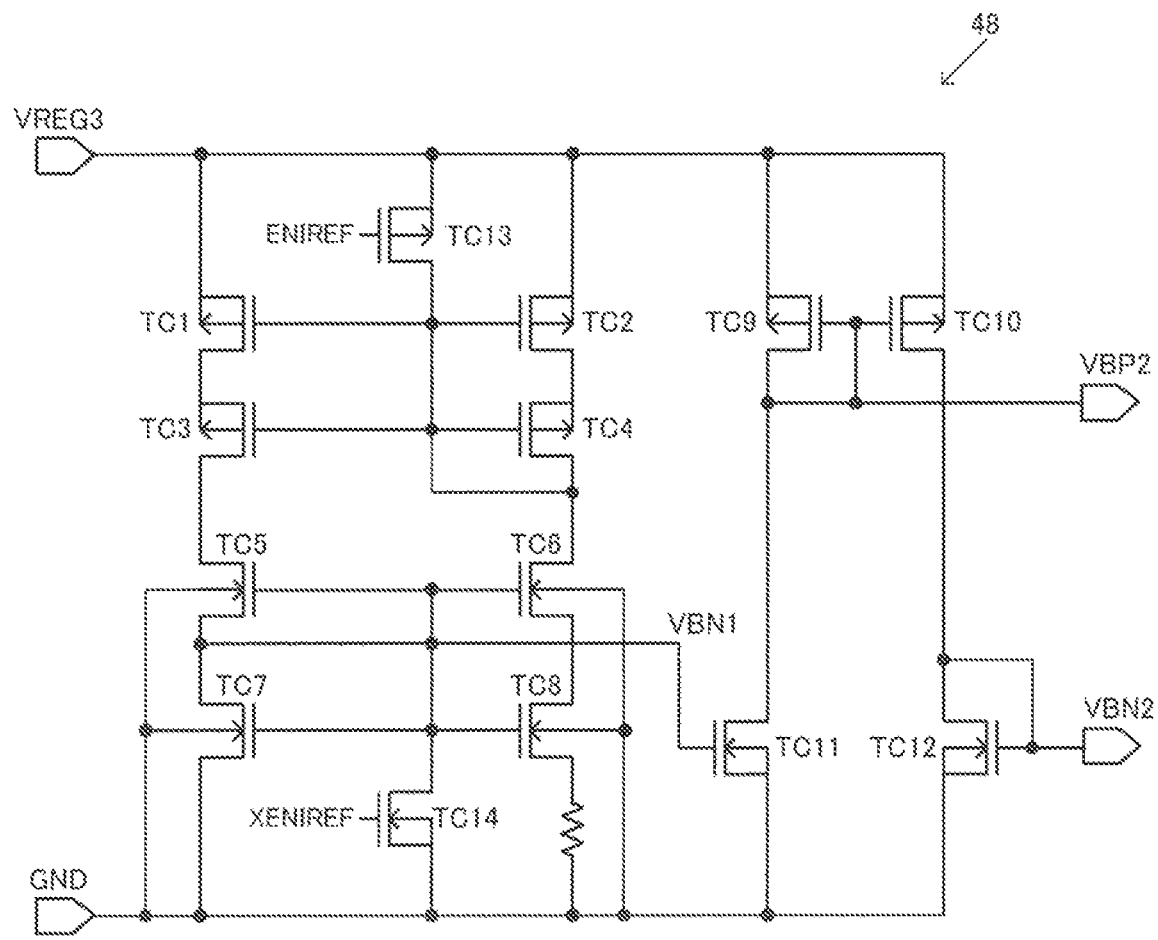
FIG. 13 illustrates an example of a configuration of a current setting circuit.

FIG. 13 illustrates an example of a configuration of the current setting circuit 48. In FIG. 13, a bias voltage VBN1 is generated by the bias voltage generation circuit constituted by the transistors TC1, TC2, TC3, TC4, TC5, TC6, TC7, and TC8. Thereafter, the bias voltages VBP2 and VBN2 corresponding to the bias voltage VBN1 are generated by the current mirror circuit constituted by the transistors TC9, TC10, TC11, and TC12 and supplied to the ring oscillator 42 in FIG. 11, and the operation current of the ring oscillator 42 is set. Note that, the enable signals ENIREF and XENIREF for enabling or disabling the operation of the current setting circuit 48 are input to the transistors TC13 and TC14. When the enable signals ENIREF and XENIREF are activated or deactivated by the logic circuit 50, the intermittent operation of the current setting circuit 48 is performed, and the intermittent operation of the temperature sensor circuit 40 is realized.

3. Power Supply Line and Ground Line Wiring

Figure 14:
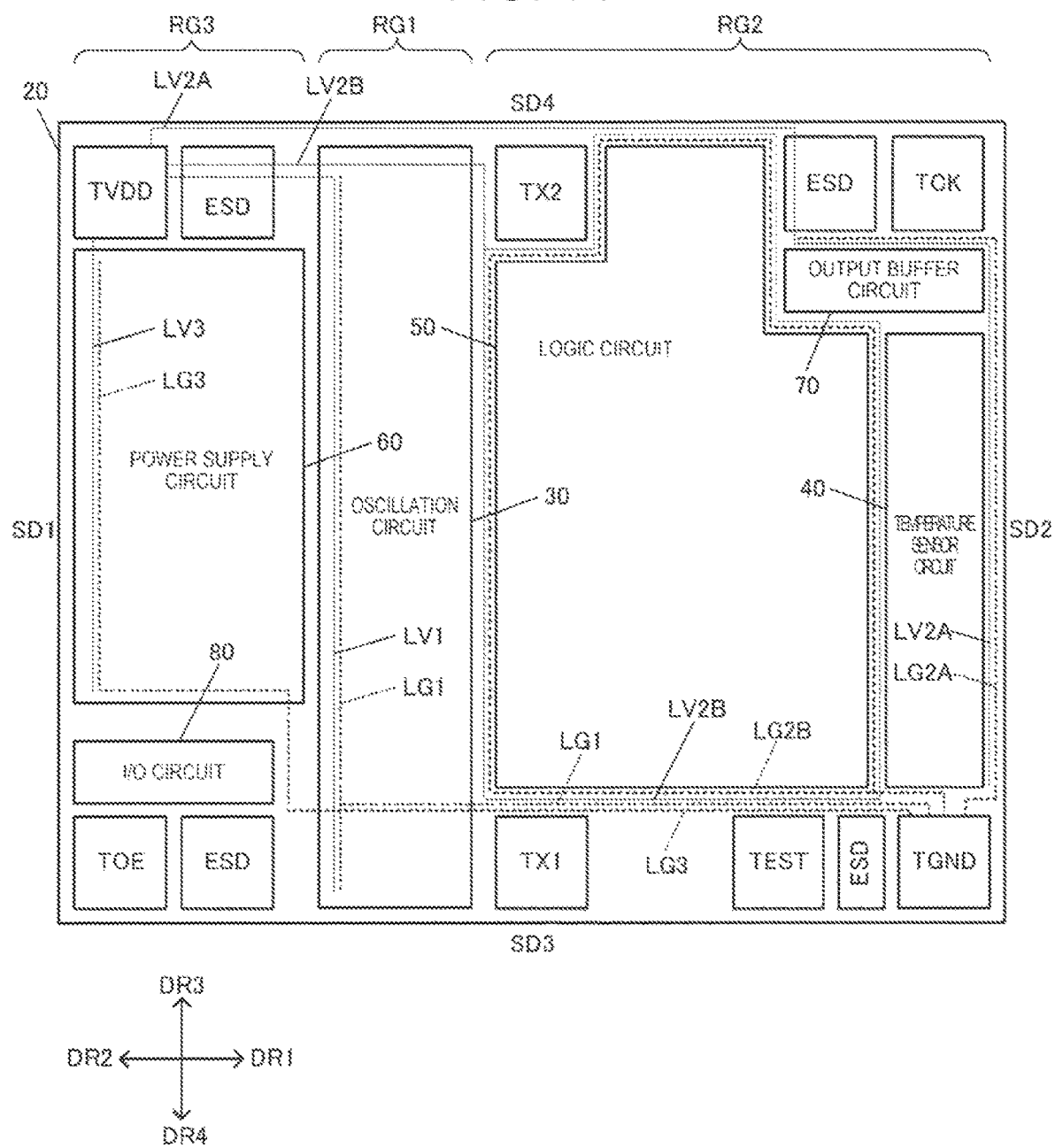
FIG. 14 illustrates an example of wirings of a power supply line and a ground line in the circuit device.

FIG. 14 illustrates an example of wirings of a power supply line and a ground line in the circuit device 20 of the present embodiment. FIG. 14 is an example of wiring of the power supply line and the ground line in the layout disposition in FIG. 2. In the layout disposition illustrated in FIG. 3, the power supply line and the ground line can be wired by using the same wiring method, so a detailed description thereof will be omitted. In FIG. 14, as described above, the power supply terminal TVDD is disposed at the first corner portion in which the side SD1 and the side SD4 intersect, and the ground terminal TGND is disposed at the second corner portion in which the side SD2 and the side SD3 intersect. That is, in the circuit device 20, the power supply terminal TVDD and the ground terminal TGND are diagonally disposed. The power supply line is wired from the power supply terminal TVDD at the first corner portion, and the ground line is wired from the ground terminal TGND at the second corner portion.

Specifically, as illustrated in FIG. 14, the circuit device 20 includes the power supply line LV1 and the ground line LG1. The LV1 is a first power supply line, and the LG1 is a first ground line. The power supply line LV1 is coupled to the power supply terminal TVDD and supplies the power supply voltage VDD to the oscillation circuit 30. The ground line LG1 is coupled to the ground terminal TGND and supplies the ground voltage GND to the oscillation circuit 30. Further, the circuit device 20 includes power supply lines LV2A and LV2B and ground lines LG2A and LG2B. The LV2A and LV2B are second power supply lines, and the LG2A and LG2B are second ground lines. The power supply lines LV2A and LV2B are coupled to the power supply terminal TVDD, are wired by branching off from the power supply terminal TVDD separately from the power supply line LV1, and supply the power supply voltage VDD to the temperature sensor circuit 40, the logic circuit 50, and the like. Specifically, the power supply line LV2A supplies the VDD to the temperature sensor circuit 40 and the output buffer circuit 70, and the power supply line LV2B supplies the VDD to the logic circuit 50. Further, the ground lines LG2A and LG2B are coupled to the ground terminal TGND, are wired by branching off from the ground terminal TGND separately from the ground line LG1, and supply the ground voltage GND to the temperature sensor circuit 40, the logic circuit 50, and the like. Specifically, the ground line LG2A supplies the GND to the temperature sensor circuit 40 and the output buffer circuit 70, and the ground line LG2B supplies the GND to the logic circuit 50. Note that the circuit device 20 can include the power supply line LV3 and the ground line LG3. The LV3 is a third power supply line, and the LG3 is a third ground line. The power supply line LV3 is coupled to the power supply terminal TVDD, is wired by branching off from the power supply terminal TVDD separately from the power supply lines LV1, LV2A, and LV2B, and supplies the power supply voltage VDD to the power supply circuit 60. Further, the ground line LG3 is coupled to the ground terminal TGND, is wired by branching off from the ground terminal TGND separately from the ground lines LG1, LG2A, and LG2B, and supplies the ground voltage GND to the power supply circuit 60.

As described above, in FIG. 14, the oscillation circuit 30 is supplied with the VDD by the power supply line LV1 that is wired from the power supply terminal TVDD and supplied with the GND by the ground line LG1 that is wired from the ground terminal TGND. On the other hand, the temperature sensor circuit 40, the logic circuit 50, and the like are supplied with the VDD by the power supply lines LV2A and LV2B, which are wired by branching off from the power supply terminal TVDD separately from the power supply line LV1, and supplied with the GND by the ground lines LG2A and LG2B, which are wired by branching off from the ground terminal TGND separately from the ground line LG1. That is, the power supply line LV1 and the power supply lines LV2A and LV2B are wired by branching off separately from the power supply terminal TVDD. The oscillation circuit 30 is supplied with the VDD by the power supply line LV1, and the temperature sensor circuit 40, the logic circuit 50, and the like are supplied with the VDD by the power supply lines LV2A and LV2B. Further, the ground line LG1 and the ground lines LG2A and LG2B are wired by branching off separately from the ground terminal TGND. The oscillation circuit 30 is supplied with the GND by the ground line LG1, and the temperature sensor circuit 40, the logic circuit 50, and the like are supplied with the GND by the ground lines LG2A and LG2B. In this way, the noise generated in the temperature sensor circuit 40, the logic circuit 50, and the like is absorbed by the power supply terminal TVDD side and the ground terminal TGND side via the power supply lines LV2A and LV2B and the ground lines LG2A and LG2B. Further, the noise is less likely to be transmitted to the power supply line LV1 and the ground line LG1 sides whose wiring impedances are higher than the impedances on the power supply terminal TVDD and the ground terminal TGND sides. As a result, it becomes possible to effectively reduce a situation in which noise generated in the temperature sensor circuit 40, the logic circuit 50, or the like is transmitted to the oscillation circuit 30 and the signal characteristics of the oscillation signal OSC deteriorate.

Further, in FIG. 14, the power supply terminal TVDD and the ground terminal TGND are diagonally disposed so that the power supply terminal TVDD is disposed at the first corner portion of the circuit device 20, and the ground terminal TGND is disposed at the second corner portion. By arranging the power supply terminal TVDD and the ground terminal TGND diagonally in this way, the power supply line LV1 and the power supply lines LV2A and LV2B can be easily wired by branching off separately at a place of the power supply terminal TVDD, and the ground line LG1 and the ground lines LG2A and LG2B can be easily wired by branching off separately at a place of the ground terminal TGND. For example, it is possible to easily wire in a direction along the side SD2 and the side SD4 such that the power supply line LV2A and the ground line LG2A pass near the temperature sensor circuit 40 and the output buffer circuit 70. Further, the power supply line LV2B and the ground line LG2B can be easily wired in a ring shape so as to surround the logic circuit 50, for example. On the other hand, the power supply line LV1 and the ground line LG1 can be easily branched and wired with respect to the oscillation circuit 30 by pulling out and wiring the power supply line LV1 and the ground line LG1 to the side of the oscillation circuit 30 from the power supply terminals TVDD and ground terminal TGND, which are diagonally disposed in the circuit device 20. Therefore, it becomes possible to wire the power supply line and the ground line in an efficient layout disposition while reducing the transmission of noise, which is generated by the noise source such as the temperature sensor circuit 40, to the oscillation circuit 30.

The noise from the temperature sensor circuit 40 and the like may be transmitted to a region of the oscillation circuit 30 via, for example, a P-type substrate of the circuit device 20. In this regard, in FIGS. 2 and 14, by disposing the layout in which the logic circuit 50 is interposed between the oscillation circuit 30 and the temperature sensor circuit 40, the distance between the oscillation circuit 30 and the temperature sensor circuit 40 can be increased, and the transmission of noise via the substrate can be effectively reduced. Further, in FIG. 3, by disposing the layout in which the power supply circuit 60 is interposed between the oscillation circuit 30 and the temperature sensor circuit 40, the distance between the oscillation circuit 30 and the temperature sensor circuit 40 can be increased, and the transmission of noise via the substrate can be effectively reduced.

4. Examples of Other Layout Dispositions

Figure 15:
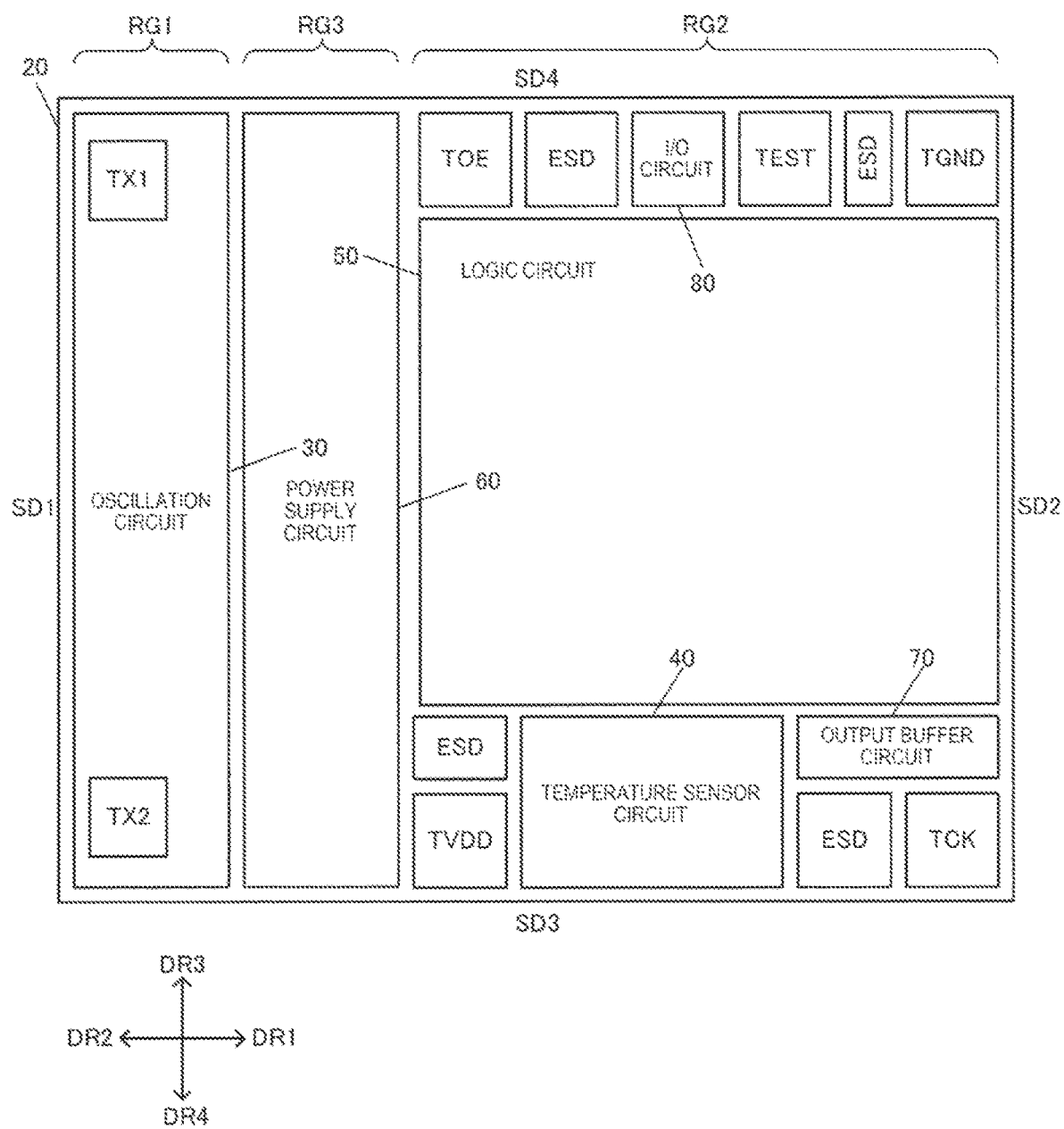
FIG. 15 illustrates another example of a layout disposition of the circuit device of the present embodiment.
Figure 16:
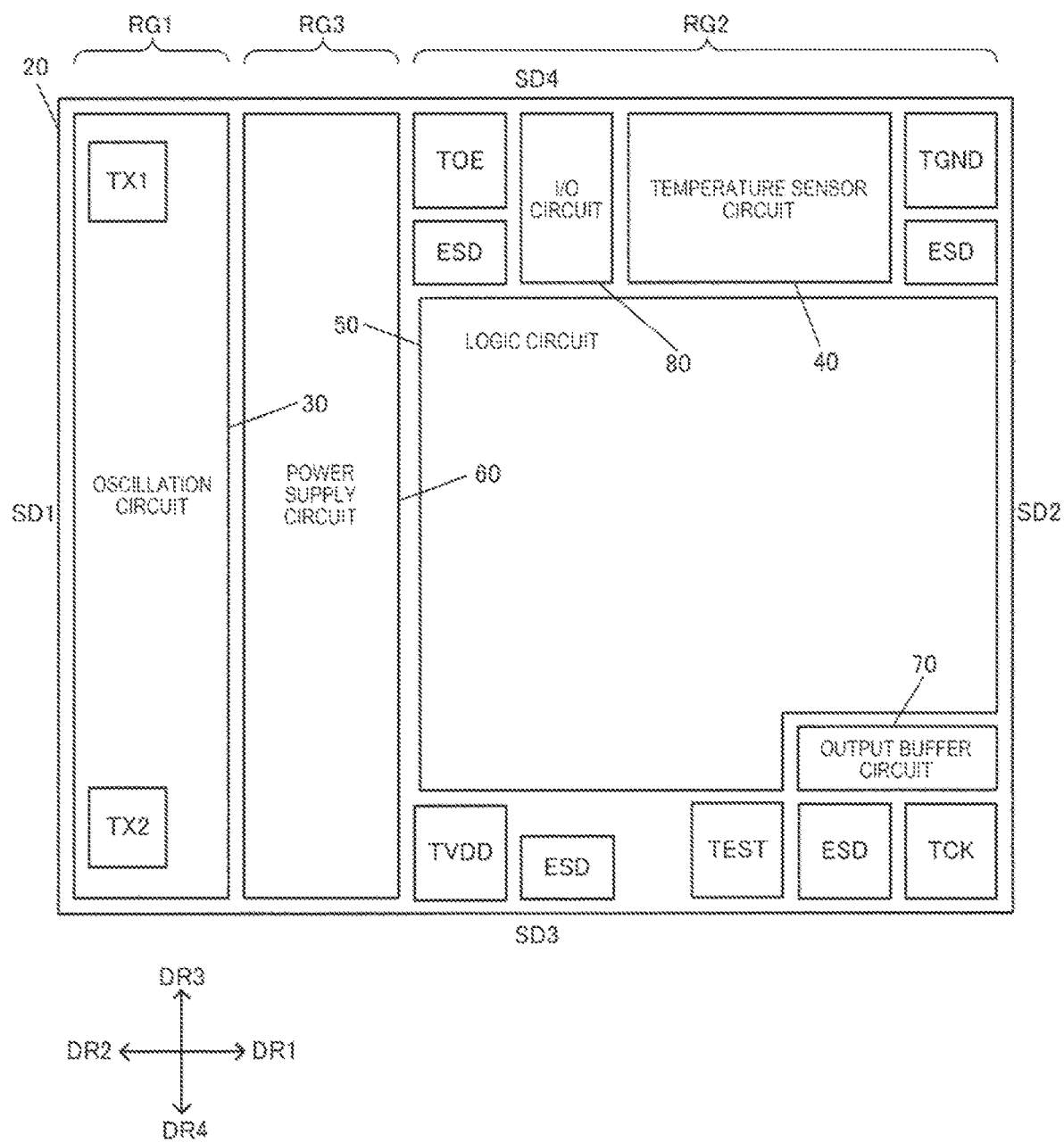
FIG. 16 illustrates still another example of a layout disposition of the circuit device of the present embodiment.
Figure 17:
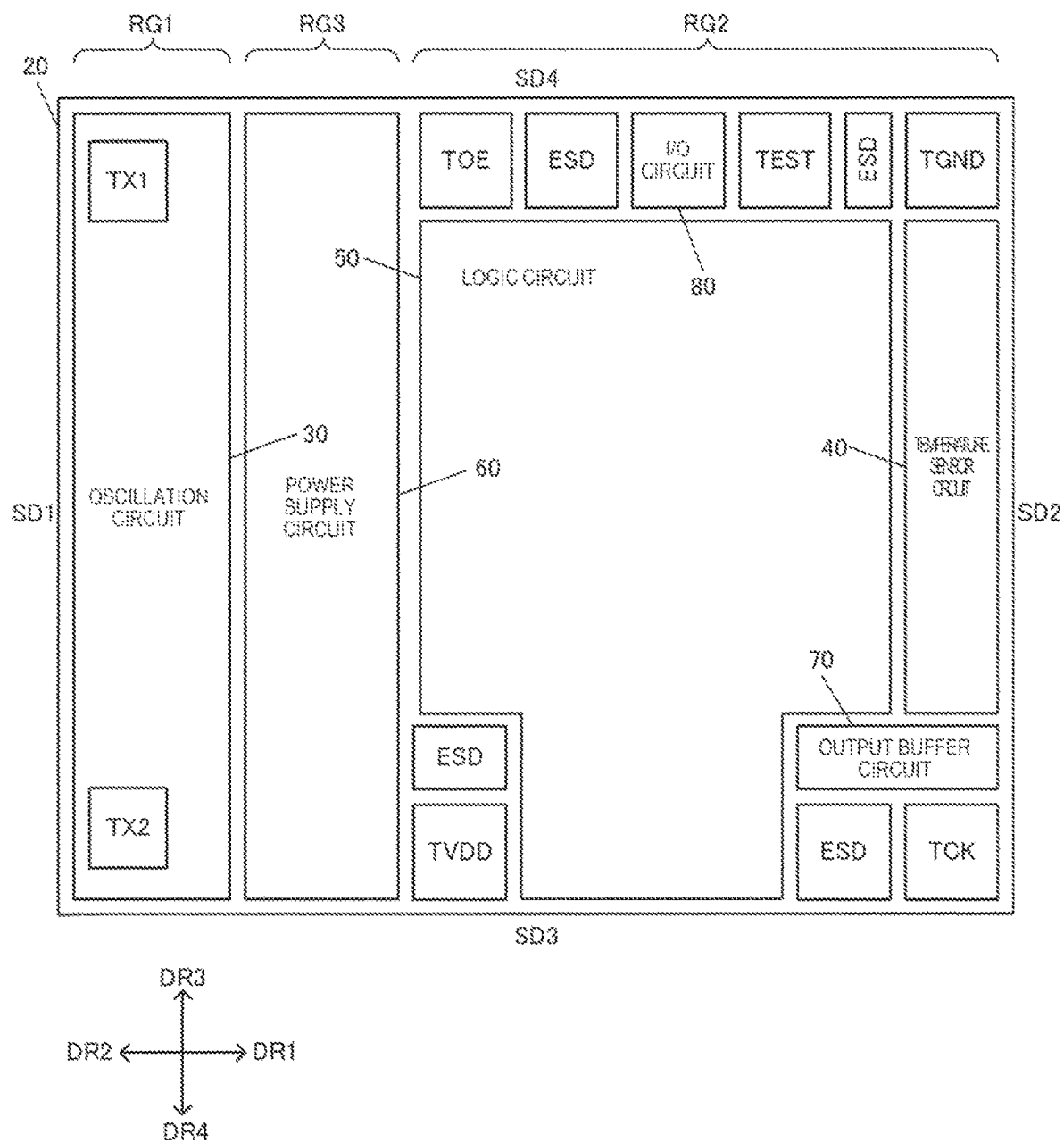
FIG. 17 illustrates still another example of a layout disposition of the circuit device of the present embodiment.

FIGS. 15, 16, and 17 illustrate examples of other layout dispositions of the circuit device 20. The layout dispositions in FIGS. 15, 16, and 17 differ from those in FIGS. 2 and 3 in the disposition of the terminals of the circuit device 20.

For example, in FIGS. 2 and 3, the output enable terminal TOE, the terminal TX1, and the ground terminal TGND are disposed in this order along the side SD3, and the power supply terminal TVDD, the terminal TX2, and the clock terminal TCK are disposed in this order along the side SD4. In this way, the disposition of the terminals of the circuit device 20 suitable for the oscillator 4 of a first structural example illustrated in FIGS. 18, 19, and 20 described later can be realized.

On the other hand, in FIGS. 15, 16, and 17, the terminal TX2, the power supply terminal TVDD, and the clock terminal TCK are disposed in this order along the side SD3, and the terminal TX1, the output enable terminal TOE, and the ground terminal TGND are disposed in this order along the side SD4. In this way, the disposition of the terminals of the circuit device 20 suitable for the oscillator 4 of a second structural example illustrated in FIGS. 21, 22, and 23 described later can be realized.

Specifically, in FIG. 2, the oscillation circuit 30 is provided between the temperature sensor circuit 40 and the logic circuit 50 and the power supply circuit 60, and in FIG. 3, the oscillation circuit 30 is provided between the temperature sensor circuit 40, the power supply circuit 60, and the logic circuit 50. Therefore, in FIGS. 2 and 3, the terminal TX1 that is coupled to the oscillation circuit 30 is disposed in the vicinity of the center of the side SD3, and the terminal TX2 that is coupled to the oscillation circuit 30 is disposed in the vicinity of the center of the side SD4. As a result, in the oscillator 4 in FIGS. 18, 19, and 20 described later, conductive coupling portions CDC1 and CDC2 that are provided in the vicinity of the center of the vibrator 10 can be easily coupled with respect to the terminals TX1 and TX2 that are provided in the vicinity of the center of the circuit device 20, in a plan view.

On the other hand, in FIGS. 15, 16, and 17, the oscillation circuit 30 is disposed along the side SD1, and the terminals TX1 and TX2, which are coupled to the oscillation circuit 30, are also disposed along the side SD1. As a result, in the oscillator 4 in FIGS. 21, 22, and 23 described later, the conductive coupling portions CDC1 and CDC2 that are provided on the left side of the vibrator 10 can be easily coupled with respect to the terminals TX1 and TX2 that are provided on the left side of the circuit device 20, in a plan view.

Further, in FIGS. 2 and 3, the output enable terminal TOE, the terminal TX1, and the ground terminal TGND are disposed on the side SD3 side, and the power supply terminal TVDD, the terminal TX2, and the clock terminal TCK are disposed on the side SD4 side. As a result, when the circuit device 20 is mounted such that the active surface thereof faces upward as in the oscillator 4 in FIGS. 18, 19, and 20, these terminals of the circuit device 20 can be coupled to the internal electrode terminals of the oscillator 4 or the like via the bump BMP. On the other hand, in FIGS. 15, 16, and 17, the terminal TX2, the power supply terminal TVDD, and the clock terminal TCK are disposed on the side SD3 side, and the terminal TX1, the output enable terminal TOE, and the ground terminal TGND are disposed on the side SD4 side. As a result, when the circuit device 20 is flip-mounted such that the active surface thereof faces downward as in the oscillator 4 in FIGS. 21, 22, and 23, these terminals of the circuit device 20 can be coupled to the internal electrode terminals of the oscillator 4 or the like via the bump BMP.

In FIGS. 15, 16, and 17, the circuit device 20 includes the oscillation circuit 30, the temperature sensor circuit 40, the logic circuit 50, and the power supply circuit 60, and the logic circuit 50 or the power supply circuit 60 is disposed between the oscillation circuit 30 and the temperature sensor circuit 40. For example, the logic circuit 50 or the power supply circuit 60 is positioned on a line connecting the position of the oscillation circuit 30 and the position of the temperature sensor circuit 40. In other words, also in FIGS. 15, 16, and 17, the distance between the oscillation circuit 30 and the temperature sensor circuit 40 is larger than the distance between the oscillation circuit 30 and the logic circuit 50 or the power supply circuit 60. That is, the temperature sensor circuit 40 is disposed at a distance farther from the oscillation circuit 30 as compared with the logic circuit 50 or the power supply circuit 60. In this way, the logic circuit 50 or the power supply circuit 60 is interposed between the oscillation circuit 30 and the temperature sensor circuit 40. By interposing the logic circuit 50 or the power supply circuit 60 in this way, a distance between the oscillation circuit 30 and the temperature sensor circuit 40 is increased. As a result, the AC fluctuation in the current consumption due to the intermittent operation of the temperature sensor circuit 40 becomes noise, and it is possible to effectively reduce a situation in which an adverse effect is given to the oscillation operation of the oscillation circuit 30, and the signal characteristics such as the jitter characteristics of the oscillation signal OSC deteriorate.

In FIGS. 15, 16, and 17, the disposition positions of the temperature sensor circuits 40 are different. For example, in FIG. 15, the temperature sensor circuit 40 is disposed along the side SD3, but in FIG. 16, the temperature sensor circuit 40 is disposed along the side SD4 which is an opposite side of the side SD3. Further, in FIG. 17, the temperature sensor circuit 40 is disposed along the side SD2 which is an opposite side of the side SD1.

Specifically, in FIG. 15, the power supply terminal TVDD and the temperature sensor circuit 40 are disposed side by side along the side SD3 of the circuit device 20. For example, the power supply terminal TVDD and the temperature sensor circuit 40 are disposed side by side in the order of the power supply terminal TVDD and the temperature sensor circuit 40 along the side SD3. For example, the temperature sensor circuit 40 is disposed on the DR1 side in the direction of the power supply terminal TVDD. By arranging the power supply terminal TVDD and the temperature sensor circuit 40 side by side along the side SD3 in this way, since the power supply voltage VDD can be supplied to the temperature sensor circuit 40 from the power supply terminal TVDD with the short path route, the parasitic resistance and the like in the route can be sufficiently reduced. Therefore, when the AC fluctuation of the current consumption occurs due to the intermittent operation of the temperature sensor circuit 40, it is possible to minimize voltage fluctuations due to parasitic resistance or the like in the route from the power supply terminal TVDD to the temperature sensor circuit 40, and it is also possible to reduce noise caused by AC fluctuations in current consumption.

On the other hand, in FIG. 16, the temperature sensor circuit 40 and the ground terminal TGND are disposed side by side along the side SD4 of the circuit device 20. For example, the temperature sensor circuit 40 and the ground terminal TGND are disposed side by side along the side SD4 in the order of the temperature sensor circuit 40 and the ground terminal TGND. For example, the ground terminal TGND is disposed on the direction DR1 side of the temperature sensor circuit 40. By arranging the temperature sensor circuit 40 and the ground terminal TGND side by side along the side SD4 in this way, since the ground voltage GND can be supplied to the temperature sensor circuit 40 from the ground terminal TGND with the short path route, the parasitic resistance and the like in the route can be sufficiently reduced. Therefore, when the AC fluctuation of the current consumption occurs due to the intermittent operation of the temperature sensor circuit 40, it is possible to minimize voltage fluctuations due to parasitic resistance or the like in the route from the temperature sensor circuit 40 to the ground terminal TGND, and it is also possible to reduce the level of noise caused by AC fluctuations in current consumption.

As described above, in FIGS. 15 and 16, the power supply terminal TVDD and the temperature sensor circuit 40, or the ground terminal TGND and the temperature sensor circuit 40 are disposed side by side along the side SD3 or the side SD4 which is the side intersecting the side SD1 and the side SD2.

On the other hand, in FIG. 17, the temperature sensor circuit 40 is disposed along the side SD2. For example, in FIG. 17, the oscillation circuit 30 is disposed along the side SD1, and the temperature sensor circuit 40 is disposed along the side SD2 which is an opposite side of the side SD1. For example, the oscillation circuit 30 is disposed along the side SD1 so that the side SD1 becomes the long side direction, and the temperature sensor circuit is disposed along the side SD2 so that the side SD2 becomes the long side direction. When the temperature sensor circuit 40 is disposed along the side SD2 which is an opposite side of the side SD1 where the oscillation circuit 30 is disposed in this way, as compared with FIGS. 15 and 16, the distance between the oscillation circuit 30 and the temperature sensor circuit 40 can be further increased. As a result, it becomes possible to further reduce the transmission of noise, which is generated by the intermittent operation of the temperature sensor circuit 40, to the oscillation circuit 30. Note that, the layout disposition of the circuit device 20 of the present embodiment is not limited to the examples of dispositions in FIGS. 2, 3, 15, 16, and 17, and various modifications can be used.

5. Oscillator

Figure 18:
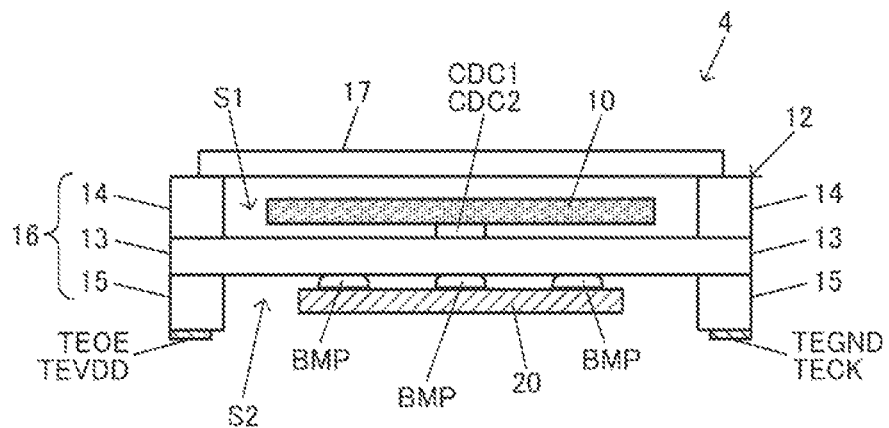
FIG. 18 is a side view of an oscillator of a first structural example.
Figure 19:
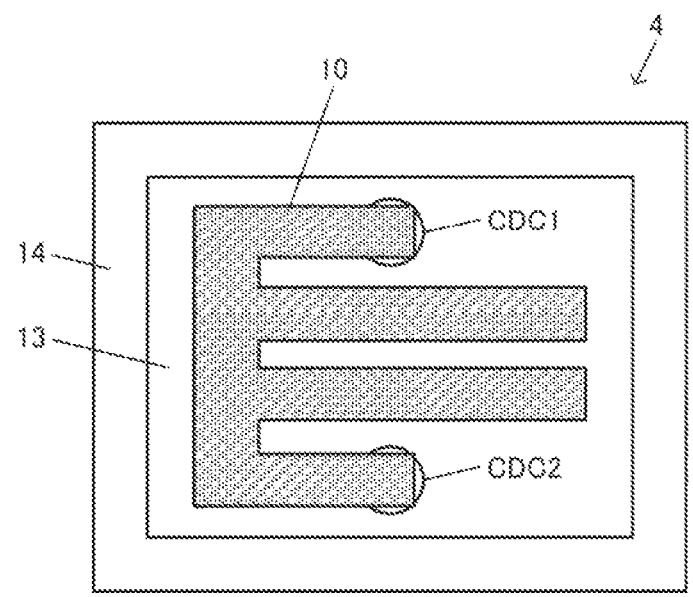
FIG. 19 is a top view of the oscillator of the first structural example.
Figure 20:
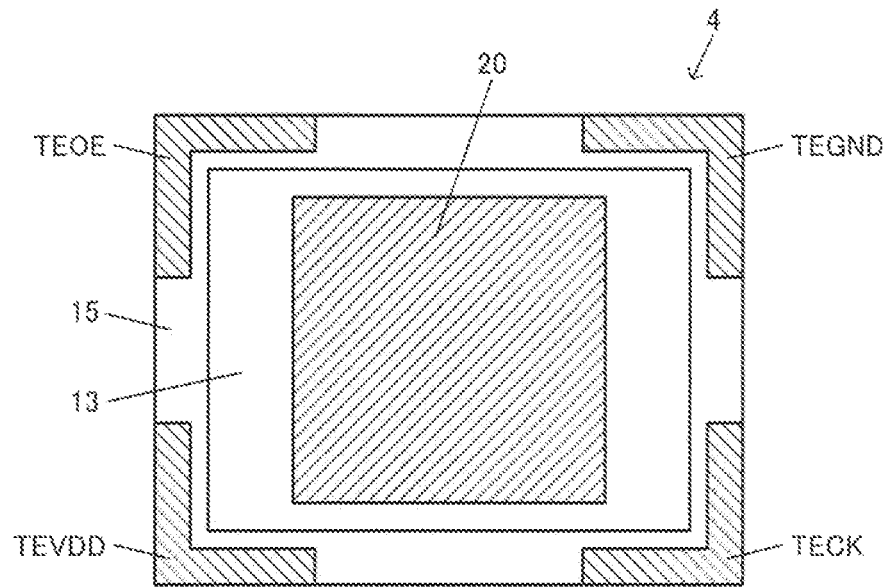
FIG. 20 is a bottom view of the oscillator of the first structural example.

FIGS. 18, 19, and 20 illustrate a first structural example of the oscillator 4 of the present embodiment. FIGS. 18, 19, and 20 are a side view, a top view, and a bottom view of the oscillator 4 of the first structural example, respectively. The oscillator 4 of the first structural example, is an oscillator in which the circuit device 20 having the layout disposition described with reference to FIGS. 2 and 3 is used. The oscillator 4 has the vibrator 10, the circuit device 20, and the package 12 that accommodates the vibrator 10 and the circuit device 20. The package 12 is made of, for example, ceramic or the like. The package 12 has a base 16 and a lid 17. The base 16 has a first substrate 13 which is an intermediate substrate, a second substrate 14 having a substantially rectangular frame shape laminated on the top surface side of the first substrate 13, and a third substrate 15 having a substantially rectangular frame shape laminated on the bottom surface side of the first substrate 13. The lid 17 is bonded to the top surface of the second substrate 14, and the vibrator 10 is accommodated in an accommodation space S1 formed by the first substrate 13, the second substrate 14, and the lid 17. For example, the vibrator 10 is hermetically sealed in the accommodation space S1 and is preferably in a reduced pressure state, which is a state close to vacuum. In this way, the vibrator 10 can be suitably protected from impact, dust, heat, moisture, and the like. Further, the circuit device 20 which is a semiconductor chip is accommodated in the accommodation space S2 formed by the first substrate and the third substrate 15. Further, on the bottom surface of the third substrate 15, external terminals TEVDD, TECK, TEGND, and TEOE, which are electrode terminals for external coupling of the oscillator 4, are formed.

Further, in the accommodation space S1, the vibrator 10 is coupled to a first electrode terminal and a second electrode terminal (not illustrated) formed on the top surface of the first substrate 13 by the conductive coupling portions CDC1 and CDC2. The conductive coupling portions CDC1 and CDC2 may be realized by conductive bumps such as metal bumps or may be realized by a conductive adhesive, for example. Specifically, a first electrode pad (not illustrated) formed at one end of the tuning fork type vibrator 10 as illustrated in FIG. 19 is coupled to the first electrode terminal that is formed on the top surface of the first substrate 13 via the conductive coupling portion CDC1. The first electrode terminal is electrically coupled to the terminal TX1 of the circuit device 20. Specifically, a second electrode pad (not illustrated) formed at the other end of the tuning fork type vibrator 10 is coupled to the second electrode terminal that is formed on the top surface of the first substrate 13 via the conductive coupling portion CDC2. The second electrode terminal is electrically coupled to the terminal TX2 of the circuit device 20. As a result, one end and the other end of the vibrator 10 can be electrically coupled to the terminals TX1 and TX2 of the circuit device 20 via the conductive coupling portions CDC1 and CDC2.

Conductive bumps BMP are formed at the terminals TVDD, TCK, TGND, TOE, TX1, and TX2 of the circuit device 20 which is a semiconductor chip, and these conductive bumps BMP are coupled to a plurality of electrode terminals formed on the bottom surface of the first substrate 13. The electrode terminals coupled to the terminals TVDD, TCK, TGND, and TOE of the circuit device 20 are electrically coupled to the external terminals TEVDD, TECK, TEGND, and TEOE of the oscillator 4 via internal wiring and the like. Further, the electrode terminals coupled to the terminals TX1 and TX2 of the circuit device 20 are electrically coupled to the vibrator 10 via the conductive coupling portions CDC1 and CDC2.

As illustrated in the bottom view of FIG. 20, the back surface of the active surface of the circuit device 20 is exposed on the bottom surface of the oscillator 4. On the bottom surface of the third substrate 15, external terminals TEVDD, TECK, TEGND, and TEOE of the oscillator 4 are formed at positions corresponding to the terminals TVDD, TCK, TGND, and TOE of the circuit devices 20 in FIGS. 2 and 3.

As described above, according to the circuit device 20 having the layout disposition illustrated in FIGS. 2 and 3, it is possible to realize the circuit device 20 having an appropriate disposition of the terminals for the oscillator 4 of the first structural example as illustrated in FIGS. 18, 19, and 20.

Figure 21:
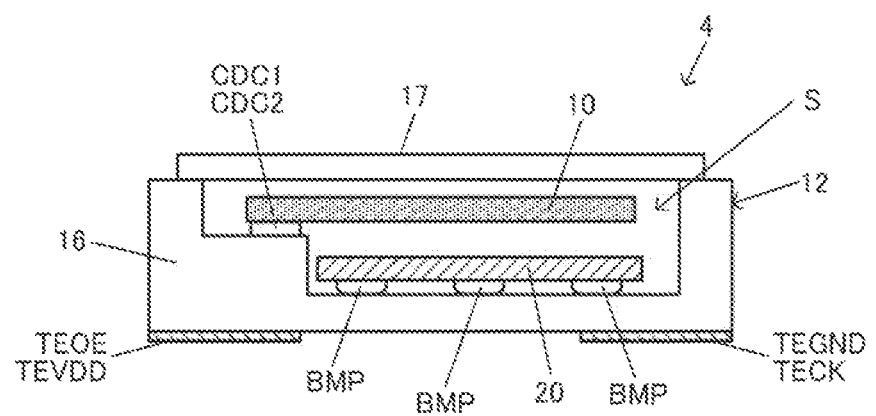
FIG. 21 is a side view of an oscillator of a second structural example.
Figure 22:
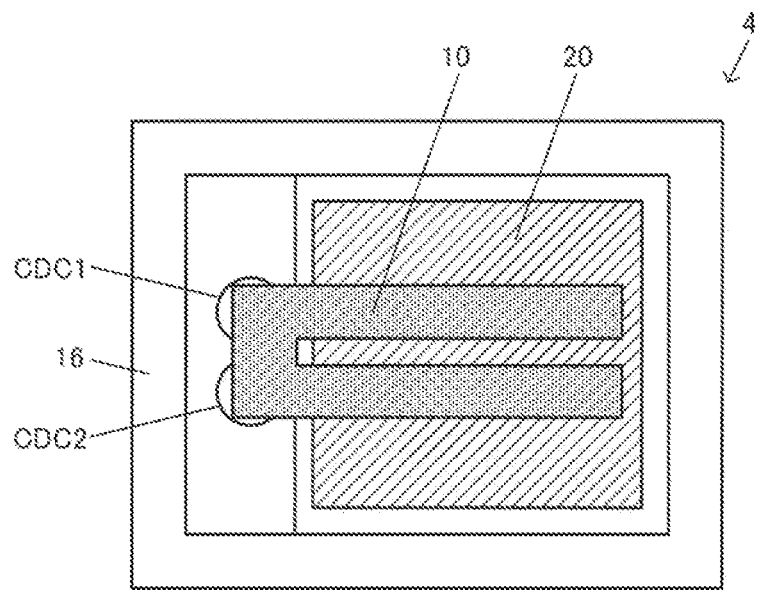
FIG. 22 is a top view of the oscillator of the second structural example.
Figure 23:
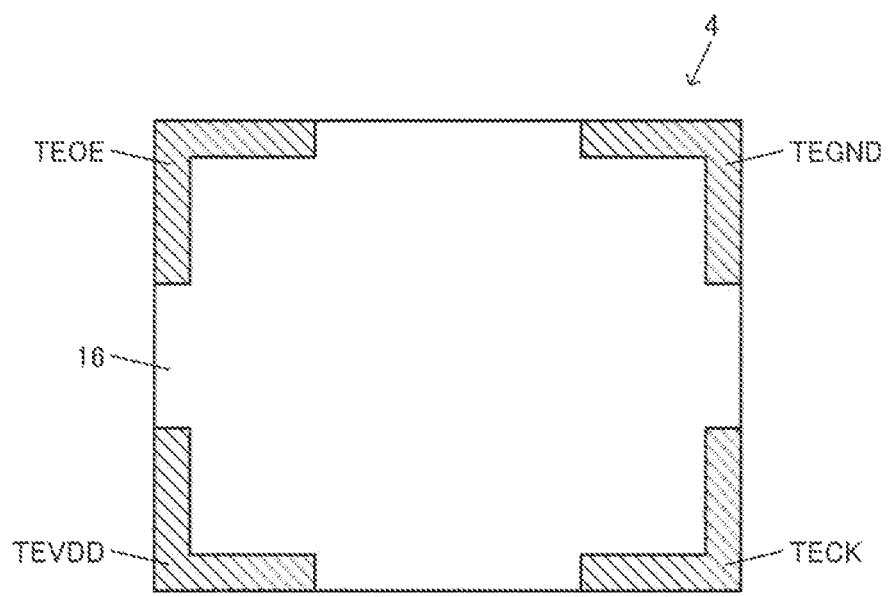
FIG. 23 is a bottom view of the oscillator of the second structural example.

FIGS. 21, 22, and 23 illustrate a second structural example of the oscillator 4 of the present embodiment. FIGS. 21, 22, and 23 are a side view, a top view, and a bottom view of the oscillator 4 of the second structural example, respectively. The oscillator 4 of the second structural example, is an oscillator in which the circuit device 20 having the layout disposition described with reference to FIGS. 15, 16, and 17 is used. The oscillator 4 has the vibrator 10, the circuit device 20, and the package 12 that accommodates the vibrator 10 and the circuit device 20. The package 12 is made of, for example, ceramic or the like, and has an accommodation space S inside thereof, and the vibrator 10 and the circuit device are accommodated in the accommodation space S. The accommodation space S is hermetically sealed and is preferably in a reduced pressure state that is close to a vacuum state. With the package 12, the vibrator 10 and the circuit device 20 can be suitably protected from impact, dust, heat, moisture, and the like.

The package 12 has a base 16 and a lid 17. Specifically, the package 12 includes a base 16 that supports the vibrator 10 and the circuit device 20, and a lid 17 that is bonded to the top surface of the base 16 so as to form an accommodation space S with the base 16. The vibrator 10 is supported by a step portion provided inside the base 16 via conductive coupling portions CDC1 and CDC2. The circuit device 20 is disposed on the inner bottom surface of the base 16. Specifically, the circuit device 20 is flip-mounted such that the active surface faces the inner bottom surface of the base 16. The active surface is a surface on which the circuit elements of the circuit device 20 are formed. Further, the conductive bumps BMP are formed at the terminals TVDD, TCK, TGND, TOE, TX1, and TX2 of the circuit device 20. The circuit device 20 is supported on the inner bottom surface of the base 16 via the conductive bumps BMP. The conductive bump BMP is, for example, a metal bump. The terminals TVDD, TCK, TGND, and TOE of the circuit device 20 are electrically coupled to the external terminals TEVDD, TECK, TEGND, and TEOE of the oscillator 4 via the bump BMP, the internal wiring of the package 12, or the like. Further, the TX1 and TX2 of the circuit device 20 are electrically coupled to the vibrator 10 via the bump BMP, the internal wiring of the package 12, the conductive coupling portions CDC1 and CDC2, or the like.

As illustrated in the top view in FIG. 22, the conductive coupling portions CDC1 and CDC2 are coupled to the positions on the root side of the tuning fork type vibrator 10. Therefore, even in the layout dispositions in FIGS. 15, 16, and 17, the terminals TX1 and TX2 electrically coupled to the coupling portions CDC1 and CDC2 are disposed along the side SD1 of the circuit device 20.

Further, as illustrated in the bottom view in FIG. 23, external terminals TEVDD, TECK, TEGND, and TEOE of the oscillator 4 are formed on the bottom surface of the base 16. That is, the external terminals TEVDD, TECK, TEGND, and TEOE are formed at positions corresponding to the terminals TVDD, TCK, TGND, and TOE of the circuit devices 20 in FIGS. 15, 16, and 17.

As described above, according to the circuit device 20 having the layout disposition illustrated in FIGS. 15, 16, and 17, it is possible to realize the circuit device 20 having an appropriate disposition of the terminals for the oscillator 4 of the second structural example as illustrated in FIGS. 21, 22, and 23.

In FIGS. 21, 22, and 23, the circuit device 20 is flip-mounted such that the active surface of the circuit device 20 faces downward, but the circuit device 20 may be mounted such that the active surface of the circuit device 20 faces upward. That is, the circuit device 20 is mounted such that the active surface faces the vibrator 10, and the coupling is performed between the terminals by using, for example, a bonding wire or the like.

As described above, the circuit device of the present embodiment includes the oscillation circuit that oscillates the vibrator to generate an oscillation signal, the temperature sensor circuit that performs the intermittent operation, the logic circuit that performs the temperature compensation processing based on the output of the temperature sensor circuit, and the power supply circuit that supplies power to the oscillation circuit. Further, the logic circuit or the power supply circuit is disposed between the oscillation circuit and the temperature sensor circuit.

According to the present embodiment, the oscillation circuit receives power from the power supply circuit, performs an oscillation operation, which oscillates a vibrator, and generates an oscillation signal. The temperature sensor circuit detects the temperature while performing the intermittent operation, and the logic circuit performs the temperature compensation processing based on the output of the temperature sensor circuit. Further, in the present embodiment, the logic circuit or the power supply circuit is disposed between the oscillation circuit and the temperature sensor circuit. In this way, the logic circuit or the power supply circuit is interposed between the oscillation circuit and the temperature sensor circuit. By interposing the logic circuit or the power supply circuit in this way, a distance between the oscillation circuit and the temperature sensor circuit can be increased by at least the logic circuit or the power supply circuit. Therefore, the AC fluctuation in the current consumption due to the intermittent operation of the temperature sensor circuit becomes noise, and it is possible to effectively reduce a situation in which an adverse effect is given to the oscillation operation of the oscillation circuit, and the signal characteristics of the oscillation signal deteriorate.

Further, in the present embodiment, the temperature sensor circuit may perform the intermittent operation of obtaining temperature data corresponding to temperature during an operation period and stopping an operation of the temperature sensor circuit after outputting the temperature data to the logic circuit.

By performing the intermittent operation in which the temperature sensor circuit repeats the operation period and the stop period in this way, the low power consumption of the circuit device can be achieved.

Further, in the present embodiment, the logic circuit may have a latch circuit that latches the temperature data output by the temperature sensor circuit during the operation period and perform the temperature compensation processing based on the latched temperature data even during a stop period of the temperature sensor circuit.

In this way, even when the temperature sensor circuit stops the operation in the stop period after the operation period, the logic circuit can properly execute the temperature compensation processing based on the temperature data that is latched by the latch circuit.

Further, in the present embodiment, the temperature sensor circuit may include a ring oscillator, a counter circuit that performs count processing for an output pulse signal of the ring oscillator by using a clock signal based on the oscillation signal and outputs temperature data based on a count value obtained by the count processing, and a regulator that supplies a regulated power supply voltage to the ring oscillator. Further, the regulator may supply the regulated power supply voltage to the ring oscillator during a period of the intermittent operation.

According to such a configuration, the temperature sensor circuit capable of performing a low voltage operation with low power consumption can be realized by using a small-scale circuit.

Further, in the present embodiment, the temperature sensor circuit may include a current setting circuit that operates based on the regulated power supply voltage and sets an operation current of the ring oscillator.

By providing such a current setting circuit and setting the operation current of the ring oscillator, it becomes possible to realize the frequency control that changes the oscillation frequency of the ring oscillator according to the temperature.

Further, in the present embodiment, the oscillation circuit, the logic circuit, and the temperature sensor circuit may be disposed between a first side and a second side, which is an opposite side of the first side, of the circuit device in order of the oscillation circuit, the logic circuit, and the temperature sensor circuit.

In this way, the logic circuit is interposed between the oscillation circuit and the temperature sensor circuit so that the transmission of noise, which is generated by the temperature sensor circuit, to the oscillation circuit can be reduced. Further, the oscillation circuit, the logic circuit, and the temperature sensor circuit can be efficiently laid out along the direction from the first side toward the second side of the circuit device so that the area of the circuit device can be reduced.

Further, in the present embodiment, the power supply circuit may be disposed between the first side and the oscillation circuit.

In this way, the power supply circuit and the oscillation circuit can be efficiently laid out along the direction from the first side toward the second side of the circuit device so that the area of the circuit device can be reduced.

Further, in the present embodiment, the temperature sensor circuit, the power supply circuit, and the oscillation circuit may be disposed between a first side and a second side, which is an opposite side of the first side, of the circuit device in order of the temperature sensor circuit, the power supply circuit, and the oscillation circuit.

In this way, the power supply circuit is interposed between the oscillation circuit and the temperature sensor circuit so that the transmission of noise, which is generated by the temperature sensor circuit, to the oscillation circuit can be reduced. Further, the temperature sensor circuit, the power supply circuit, and the oscillation circuit can be efficiently laid out along the direction from the first side toward the second side of the circuit device so that the area of the circuit device can be reduced.

Further, in the present embodiment, the logic circuit may be disposed between the oscillation circuit and the second side.

In this way, the oscillation circuit and the logic circuit can be efficiently laid out along the direction from the first side toward the second side of the circuit device so that the area of the circuit device can be reduced.

Further, in the present embodiment, the circuit device may include a first terminal coupled to one end of the vibrator, a second terminal coupled to the other end of the vibrator, a power supply terminal to which a power supply voltage is input, and a ground terminal to which a ground voltage is input. Further, the first terminal and the ground terminal may be disposed along a third side intersecting the first side and the second side of the circuit device, and the power supply terminal and the second terminal may be disposed along a fourth side, which is an opposite side of the third side of the circuit device.

In this way, in the layout disposition where the logic circuit or power supply circuit is disposed between the oscillation circuit and the temperature sensor circuit, the first terminal coupled to one end of the vibrator can be disposed at the position corresponding to the oscillation circuit on the third side of the circuit device, and the ground terminal can also be disposed along the third side together with the first terminal. Further, the second terminal coupled to the other end of the vibrator can be disposed at the position corresponding to the oscillation circuit on the fourth side of the circuit device, and the power supply terminal can also be disposed along the fourth side together with the second terminal.

Further, in the present embodiment, the power supply terminal may be disposed at a first corner portion in which the first side and the fourth side intersect, and the ground terminal may be disposed at a second corner portion in which the second side and the third side intersect.

In this way, the ground terminal disposed at the second corner portion and the first terminal coupled to one end of the vibrator can be efficiently disposed along the third side. Further, the power supply terminal disposed at the first corner portion and the second terminal coupled to the other end of the vibrator can be efficiently disposed along the fourth side.

Further, in the present embodiment, the circuit device may include a clock terminal outputting an output clock signal based on the oscillation signal, in which the clock terminal may be disposed at a third corner portion in which the second side and the fourth side intersect.

In this way, the clock terminal that becomes a noise source can be disposed at the third corner portion in which the second side and the fourth side intersect, and the transmission of noise of the output clock signal at the clock terminal to the oscillation circuit can be reduced.

Further, in the present embodiment, the circuit device may include a power supply terminal to which a power supply voltage is input, in which the power supply circuit may be disposed between the power supply terminal and the oscillation circuit.

In this way, the power supply voltage can be supplied to the power supply circuit from the power supply terminal with a short path route, and the power supply circuit can supply power with respect to the oscillation circuit with a short path route based on the supplied power supply voltage. Therefore, it is possible to supply an appropriate power based on the power supply voltage from the power supply terminal to the oscillation circuit.

Further, in the present embodiment, the circuit device may include an output buffer circuit outputting an output clock signal based on the oscillation signal and a clock terminal from which the output clock signal is output, in which the output buffer circuit may be disposed between the clock terminal and the logic circuit.

In this way, the clock signal, which is output by the logic circuit based on the oscillation signal, is input to the output buffer circuit with a short path route and buffered, and is output from the clock terminal as the output clock signal. As a result, it becomes possible to reduce deterioration of the signal characteristics of the output clock signal caused by the parasitic resistance and the parasitic capacitor in the route.

Further, the present embodiment relates to an oscillator including the circuit device described above and the vibrator.

Although the present embodiment has been described in detail as described above, it will be easily understood by those skilled in the art that many modifications can be made without departing from the novel matters and effects of the present disclosure. Accordingly, all such modification examples are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations/operations of the circuit device and oscillator are not limited to those described in the present embodiment, and various modifications can be made.

What is claimed is:

1. A circuit device comprising:
an oscillation circuit generating an oscillation signal by oscillating a vibrator;

a temperature sensor circuit performing an intermittent operation;

a logic circuit performing temperature compensation processing based on an output of the temperature sensor circuit; and a power supply circuit supplying power to the oscillation circuit, wherein the logic circuit or the power supply circuit is disposed between the oscillation circuit and the temperature sensor circuit, the temperature sensor circuit performs the intermittent operation of obtaining temperature data corresponding to temperature during an operation period and stopping an operation of the temperature sensor circuit after outputting the temperature data to the logic circuit, and the logic circuit his a latch circuit that latches the temperature data output by the temperature sensor circuit during the operation period and performs the temperature compensation processing based on the latched temperature data even ring a stop period of the temperature sensor circuit.

2. The circuit device according to claim 1, wherein the oscillation circuit, the logic circuit, and the temperature sensor circuit are disposed between a first side and a second side, which is an opposite side of the first side, of the circuit device in order of the oscillation circuit, the logic circuit, and the temperature sensor circuit.

3. The circuit device according to claim 2, wherein the power supply circuit is disposed between the first side and the oscillation circuit.

4. The circuit device according to claim 1, wherein the temperature sensor circuit, the power supply circuit, and the oscillation circuit are disposed between a first side and a second side, which is an opposite side of the first side, of the circuit device in order of the temperature sensor circuit, the power supply circuit, and the oscillation circuit.

5. The circuit device according to claim 4, wherein the logic circuit is disposed between the oscillation circuit and the second side.

6. The circuit device according to claim 2, further comprising:

a first terminal coupled to one end of the vibrator;

a second terminal coupled to the other end of the vibrator;

a power supply terminal to which a power supply voltage is input; and a ground terminal to which a ground voltage is input, wherein the first terminal and the ground terminal are disposed along a third side intersecting the first side and the second side of the circuit device, and the power supply terminal and the second terminal are disposed along a fourth side, which is an opposite side of the third side, of the circuit device.

7. The circuit device according to claim 6, wherein the power supply terminal is disposed at a first corner portion in which the first side and the fourth side intersect, and the ground terminal is disposed at a second corner portion in which the second side and the third side intersect.

8. The circuit device according to claim 7, further comprising:

a clock terminal outputting an output clock signal based on the oscillation signal, wherein the clock terminal is disposed at a third corner portion in which the second side and the fourth side intersect.

9. The circuit device according to claim 1, further comprising:

a power supply terminal to which a power supply voltage is input, wherein the power supply circuit is disposed between the power supply terminal and the oscillation circuit.

10. The circuit device according to claim 1, further comprising:

an output buffer circuit outputting an output clock signal based on the oscillation signal; and a clock terminal outputting the output clock signal, wherein the output buffer circuit is disposed between the clock terminal and the logic circuit.

11. An oscillator comprising:

the circuit device according to claim 1; and the vibrator.

12. A circuit device comprising:

an oscillation circuit generating an oscillation signal by oscillating a vibrator;

a temperature sensor circuit performing an intermittent operation;

logic circuit performing temperature compensation processing based on an output of the temperature sensor circuit; and a power supply circuit supplying power to the oscillation circuit, wherein the logic circuit or the power supply circuit is disposed between the oscillation circuit and the temperature sensor circuit, the temperature sensor circuit includes a ring oscillator, a counter circuit that performs count processing for an output pulse signal of the ring oscillator by using a clock signal based on the oscillation signal and outputs temperature data based on a count value obtained by the count processing, and a regulator that supplies a regulated power supply voltage to the ring oscillator, and the regulator supplies the regulated power supply voltage to the ring oscillator during a period of the intermittent operation.

13. The circuit device according to claim 12, wherein the temperature sensor circuit includes a current setting circuit that operates based on the regulated power supply voltage and sets an operation current of the ring oscillator.

* * * * *